United States Patent
Livesay et al.

(10) Patent No.: US 7,026,634 B2
(45) Date of Patent: Apr. 11, 2006

(54) METHOD AND APPARATUS FOR FORMING OPTICAL MATERIALS AND DEVICES

(75) Inventors: William R. Livesay, San Diego, CA (US); Scott M. Zimmerman, Basking Ridge, NJ (US)

(73) Assignee: e-Beam & Light, Inc., Carlsbad, CA (US)

( * ) Notice: Subject to any disclaimer, the term of this patent is extended or adjusted under 35 U.S.C. 154(b) by 27 days.

(21) Appl. No.: 10/183,784

(22) Filed: Jun. 27, 2002

(65) Prior Publication Data

US 2003/0038251 A1 Feb. 27, 2003

Related U.S. Application Data

(60) Provisional application No. 60/302,152, filed on Jun. 28, 2001.

(51) Int. Cl.
*H01J 31/30* (2006.01)

(52) U.S. Cl. ............................. 250/492.3; 250/492.1; 250/492.2

(58) Field of Classification Search ............. 250/492.1, 250/492.2, 492.3; 438/31–32, 473, 638, 787; 427/542
See application file for complete search history.

(56) References Cited

U.S. PATENT DOCUMENTS

| | | | |
|---|---|---|---|
| 4,808,285 A | | 2/1989 | Chen et al. |
| 5,003,178 A | * | 3/1991 | Livesay |
| 5,101,297 A | * | 3/1992 | Yoshida et al. ............. 359/566 |
| 5,108,201 A | | 4/1992 | Matsuura et al. |
| 5,271,082 A | | 12/1993 | Braglia et al. |
| 5,291,575 A | | 3/1994 | Yanagawa et al. |

(Continued)

OTHER PUBLICATIONS

Nakayama et al, Nonlinear optical waveguide fabrication by direct electron beam irradiation andthermal development using a high Tg polymer, 1997, Annual Physics Letters, 71, p. 1924–1926.*

(Continued)

*Primary Examiner*—Nikita Wells
*Assistant Examiner*—Christopher M. Kalivoda
(74) *Attorney, Agent, or Firm*—William Propp

(57) ABSTRACT

The invention provides a process for forming optical components and new optical materials utilizing electron beam irradiation. The process comprises selectively irradiating optical materials to alter their index of refraction gradient three dimensionally. With the inventive process, new optical materials can be created that have enhanced optical properties over the un-irradiated material. The invention also provides a process in which optical components can be fabricated without requiring a planar/multiple layer process, thereby simplifying the fabrication of these optical components. The inventive process uses a controlled electron beam to alter the properties of optical materials. By using the radiation of a controlled electron beam, controlled changes in the index of refraction gradient of optical materials can be obtained. Further, radiation of the electron beam can be used to create new optical materials from materials not previously believed to be suitable for optical applications. This is based not only on the refractive index change created in the material, but also upon the change in other material properties such as elimination of melt and reduced solubility in normal solvents. In these cases, the electron beam modifies and creates a new networks structure within the material, which enhances its optical properties and allows for the formation of useful physical properties necessary for the fabrication of useful devices (i.e., resulting in wholly new optical materials). It is also disclosed that the inventive process can be used to produce a spatially graded index of refraction within a material to enhance the performance of an optical waveguide which can lead to a number of novel structures.

71 Claims, 20 Drawing Sheets

U.S. PATENT DOCUMENTS

| | | | |
|---|---|---|---|
| 5,376,586 A | | 12/1994 | Beilin et al. |
| 5,572,619 A | * | 11/1996 | Maruo et al. ............... 385/143 |
| 5,598,501 A | | 1/1997 | Maruo et al. |
| 5,770,826 A | * | 6/1998 | Chaudhari et al. ..... 204/157.15 |
| 6,132,814 A | * | 10/2000 | Livesay et al. ............. 438/787 |
| 6,306,563 B1 | * | 10/2001 | Xu et al. .................... 430/321 |
| 6,407,399 B1 | * | 6/2002 | Livesay ................... 250/492.3 |
| 6,607,991 B1 | * | 8/2003 | Livesay et al. ............. 438/787 |

OTHER PUBLICATIONS

T. Suhara et al., "Electron Beam induced Refractive Index . . . " Japanese Journal of Applied Physics, 1975, vol. 14, No. 7, pp. 1079–1080.

A. Houghton et al., "Optical Waveguide formed by low energy irradiation . . . " Applied Physics Letters, 1976, vol. 29, No. 9, pp. 565–566.

T. Suhara et al., "Temporary Absorption of Guided Light . . . " Japanese Journal of Applied Physics, 1977, vol. 16, No. 10, pp. 1877–1878.

H. Kotani et al., "Direct Writing of Gratings by Electron Beam . . . " Japanese Journal of Applied Physics, 1979, vol. 18, No. 2, pp. 279–283.

M. Rooks et al., "Polyimide optical waveguides . . . " Applied optics, 1990, vol. 29, No. 27, pp. 3880–3882.

S. Madden et al., Optical channel waveguide fabrication Applied Physics Letters, 1990, vol. 57, No. 27, pp. 2902–2903.

R. Syms et al., "near Infrared Channel Waveguide . . . ", Journal of Lightwave Technology, 1994, vol. 12, No. 12, pp. 2085–2091.

R. Syms et al., "Low–Loss Near–Infrared Passive . . . " Journal of Lightwave Technology, 1995, vol. 13, No. 8 pp. 1745–1749.

Y. Maruo et al., Embedded channel polyimide waveguide . . . Journal of Lightwave Technology, 1995, vol. 13, No. 8, pp. 1718–1723.

Y. Maruo et al., "Channel optical waveguide fabrication . . . " Applied Optics, 1995, vol. 34, No. 6, pp1047–1052.

H. Nakayama et al., "Non–linear optical waveguide . . . " Applied Physics Letters, 1997, vol. 71, No. 14, pp. 1924–1926.

N.Nordman et al., "Characterization of refractive index change . . . " Journal of Applied Physics, 1997, vol. 82, No. 4, pp. 1521–1524.

H. Nakayama et al., "Fabrication Technique . . . ", Applied Optics, 1998, vol. 37, No. 7, pp. 1213–1219.

A. Nakao et al., "Electron Beam writing fabrication . . . ". Japanese Journal of Applied Physics, 1998, vol. 3 Part 1, No. 3A, pp. 845–846.

A. Syahriar, "Thermo–optic Interferometric . . . ". Journal of Lightwave Technology, 1998, vol. 16, No. 5, pp. 841–846.

S. Spaargaren et al., "Characterization of defects . . . " Journal of Lightwave Technology, 2000, vol. 18, No. 4, pp. 555–561.

W. Wong et al., Low–loss polymeric optical waveguides . . . Applied Physics Letters, 2001, vol. 78, No. 15, pp. 2110–2112.

\* cited by examiner

— OR —

— OR —

— OR —

— OR —

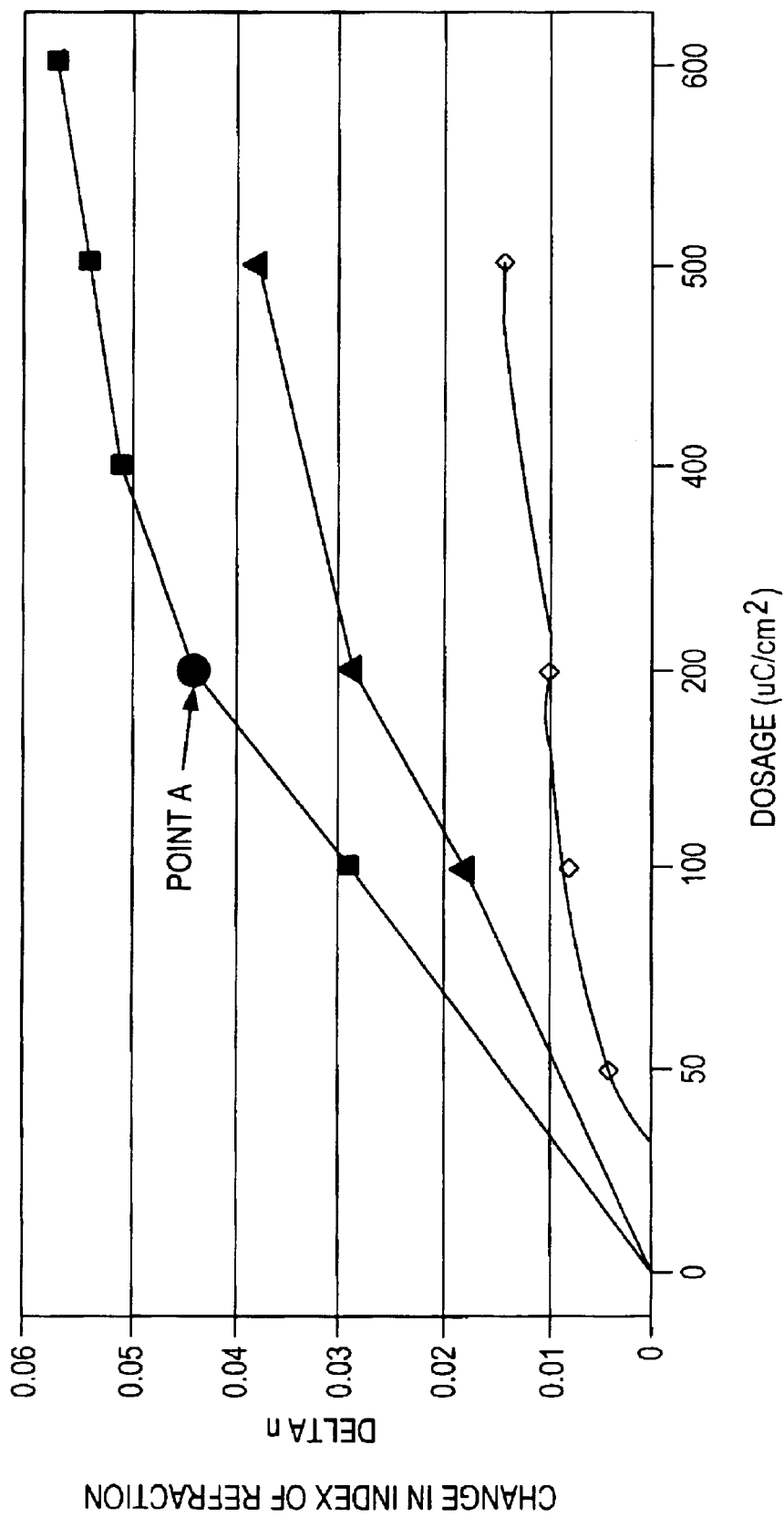

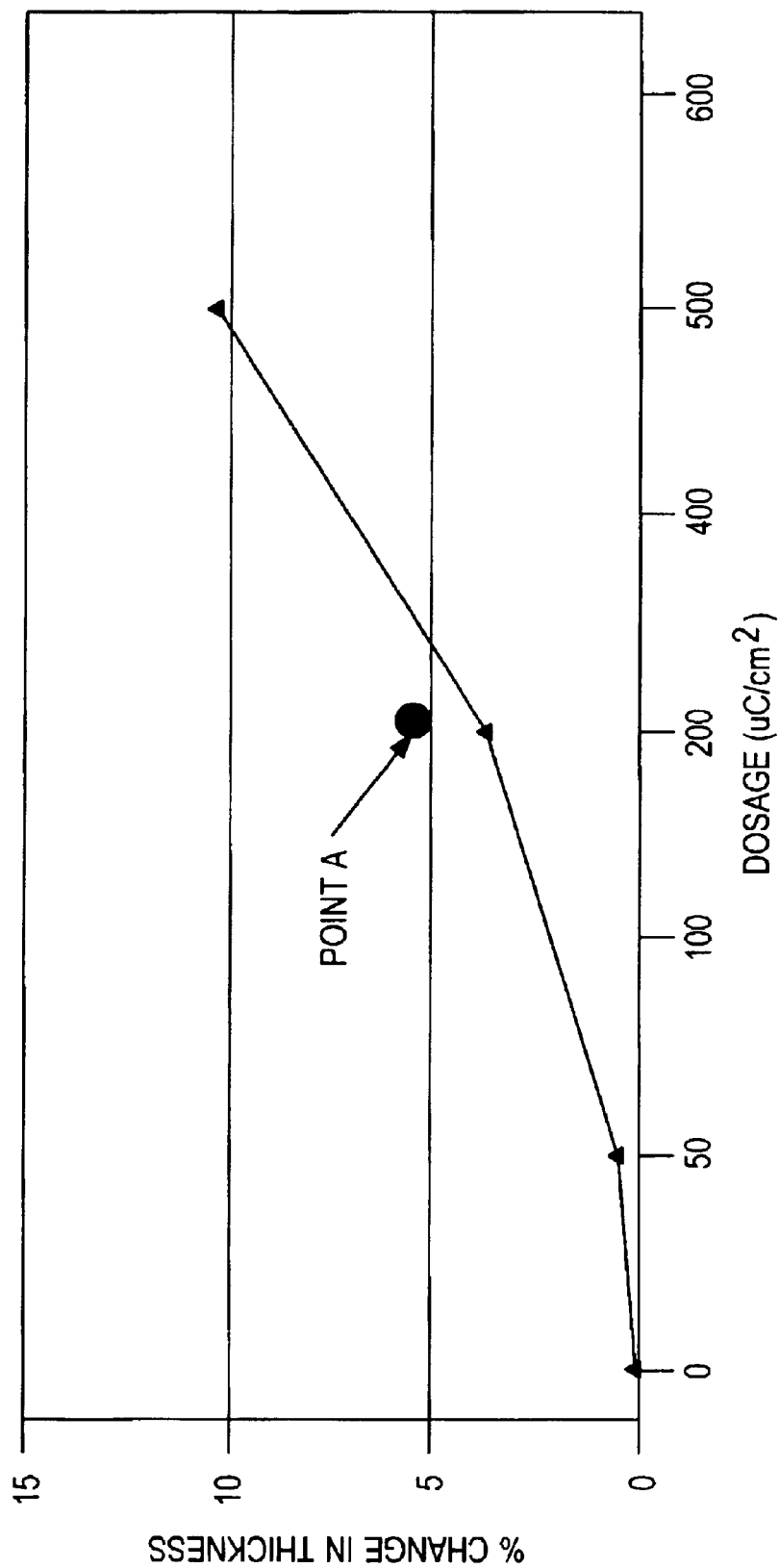

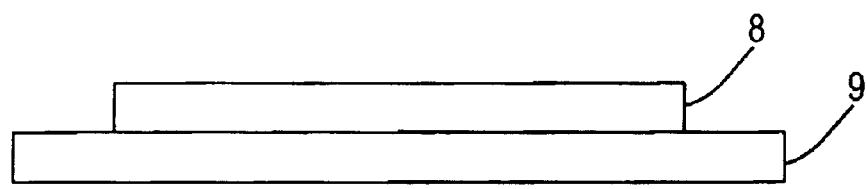
FIG. 13A
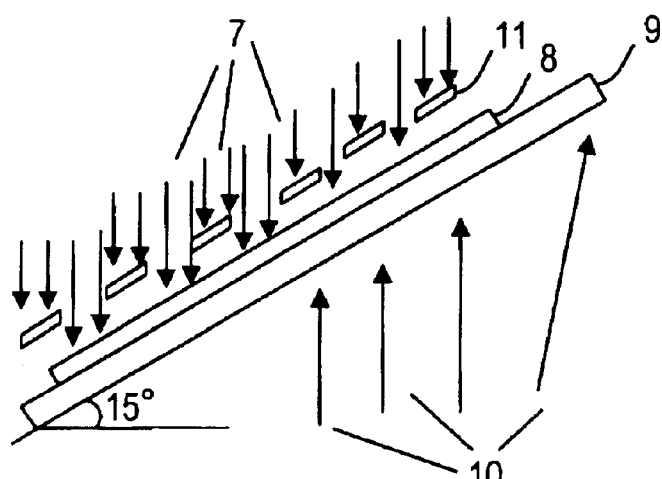
FIG. 13B
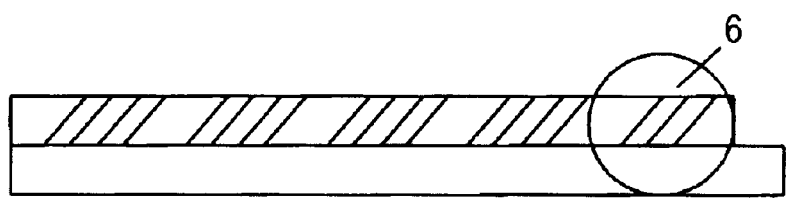
FIG. 13C
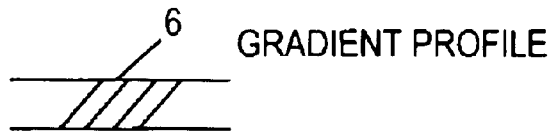
GRADIENT PROFILE

METHOD AND APPARATUS FOR FORMING OPTICAL MATERIALS AND DEVICES

This application claims the benefit of Provisional Application No. 60/302,152, filed Jun. 28, 2001.

BACKGROUND OF THE INVENTION

1. Field of the Invention

The present invention relates generally to the fabrication of optical materials used in optical communication and integrated optical circuits using electron beam radiation and more specifically to a method for fabricating optical devices by inducing changes in the index of refraction in optical materials utilizing electron beam radiation.

2. Description of the Prior Art

Optical materials such as polymers and spin-on-glasses have found widespread use in optical communication and integrated optics applications. Typically, these optical materials are utilized to form waveguides and carry optical signals along a designated path. These optical waveguides are typically formed by utilizing materials of different refractive index. The inner waveguide material typically exhibits high optical transmission and has a higher optical index of refraction relative to the cladding or boundary material to maximize the internal reflection of the optical signal being transmitted and thus, minimize signal loss. To minimize signal loss, the ratio of the refracted indices of the inner and outer material are tailored to satisfy very specific specifications. The current state of the art of producing these waveguides and producing these materials of different index of refraction is to utilize two different materials, which are layered in an additive or subtractive process. The waveguides may also be fabricated by chemical vapor deposition of the different optical materials. In one prior art method, optical material having an intrinsic index of refraction is layered with another material, itself with an intrinsic (different) index of refraction, to create the layered waveguide.

In the prior art, the optical waveguide includes a core of material surrounded by a cladding of a dissimilar material than the core. The dissimilar material means that the material comprising the cladding and the material comprising the core are structurally and/or chemically distinct having been fabricated as physically different materials and brought together during the assembly process for the optical waveguide. Several methods are known in the art for waveguide formation, one being where an optical adhesive is used to bond the core to the cladding media. In those instances where an optical waveguide is on a chip, the fabrication process typically includes preparing a flat, optical surface on both the chosen core material and the chosen cladding substrate. Fused silica is typically used as a support substrate due to availability and low refractive index. In the case of very thin (adhesive) glue layers (<1 μm), the channel must be surrounded by a lower refractive index material for efficient waveguiding action. The refractive index of the selected optical core material dictates and limits the index range for the cladding or support regions. Other requirements of the surrounding medium are processing compatibility with the optical material, availability of the material, and adhesive bonding affinity.

In the case of thick glue layers, the refractive index of the glue provides the cladding index and influences the waveguide properties. In this situation, the support substrates may be selected for their processing qualities irrespective of the refractive index. The multiple layers of different materials create problems in fabrication as edge breakage and differential polishing rates between the glue and core/cladding materials must be taken into account as well as controlling appropriate glue thickness.

In all of these prior art techniques, the two dissimilar materials utilized to form the core and cladding layers must have the appropriate matched indices of refraction to achieve the desired optical coupling. These fabrication techniques are further complicated if optical adhesives are used which then must have the appropriate optical index for the device to work properly. For example, when distinctly different materials are used such as grating formation in waveguides fabricated using these techniques, complications arise due to the different exposure response of the two materials. This is especially bothersome in the case of narrow line width gratings. In the current state of the art, optical materials that can be processed which exhibit high transmission, low birefringence, and selected optical indices are very expensive and the range of indices is very limited, especially between compatible materials. Due to the explosion of optical networks and interconnects required by high-speed data transmission and the growth of the Internet, a need exists to fabricate material having a specific index of refraction and to perform multiple process steps in the same material. With such an ability, custom optical materials can be made from the same starting material or known materials can be tuned to work more advantageously with other materials.

SUMMARY OF THE INVENTION

The invention provides a process for forming optical components and new optical materials utilizing electron beam irradiation. The process comprises selectively irradiating optical materials to alter their index of refraction three dimensionally. With the inventive process, new optical materials can be created by altering the bond structure within the material such that enhanced optical properties are achieved over the native un-irradiated material. The invention also provides a process in which optical components can be fabricated without requiring a planar/multiple layer process, thereby simplifying the fabrication of these optical components. The inventive process uses a controlled electron beam to alter the properties of optical materials. For example, by using the radiation of a controlled electron beam, controlled changes in the index of refraction gradient of optical materials can be obtained. Further, radiation of the electron beam can be used to create new optical materials from materials not previously believed to be suitable for optical applications. This is based not only on the refractive index change created in the material, but also upon the change in other material properties such as elimination of melt and reduced solubility in normal solvents. In these cases, the electron beam modifies and creates a new networks structure within the material, which enhances its optical properties and allows for the formation of useful physical properties necessary for the fabrication of useful devices (i.e., resulting in wholly new optical materials). It has also been determined that the inventive process can be used to produce a spatially graded index of refraction within a material to enhance the performance of an optical waveguide which can lead to a number of novel structures. In addition, it is possible to create differing zones of optical properties within a homogenous material by selectively exposing the material to radiation from a controlled voltage electron beam system. By controlling the incident energy of the electron beam, one can alter the optical properties as a function of depth to create a layered structure within a previously homogenous material layer.

The foregoing has outlined, rather broadly, the preferred feature of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention and that such other structures so not depart from the spirit and scope of the invention is its broadest form.

BRIEF DESCRIPTION OF THE DRAWINGS

Other aspects, features, and advantages of the present invention will become more filly apparent from the following detailed description, the appended claim, and the accompanying drawings in which:

FIG. 8 shows a graph depicting the change in surface refractive index as a function of electron beam dosage while maintaining current and energy constant;

FIG. 9 shows a graph depicting the change in sample thickness as a function of electron beam dosage while maintaining current and energy constant;

FIG. 13 shows in FIGS. 13A, 13B and 13C schematic views of off axis exposures and the resulting optical structures;

DETAILED DESCRIPTION OF THE INVENTION

Figure 1:
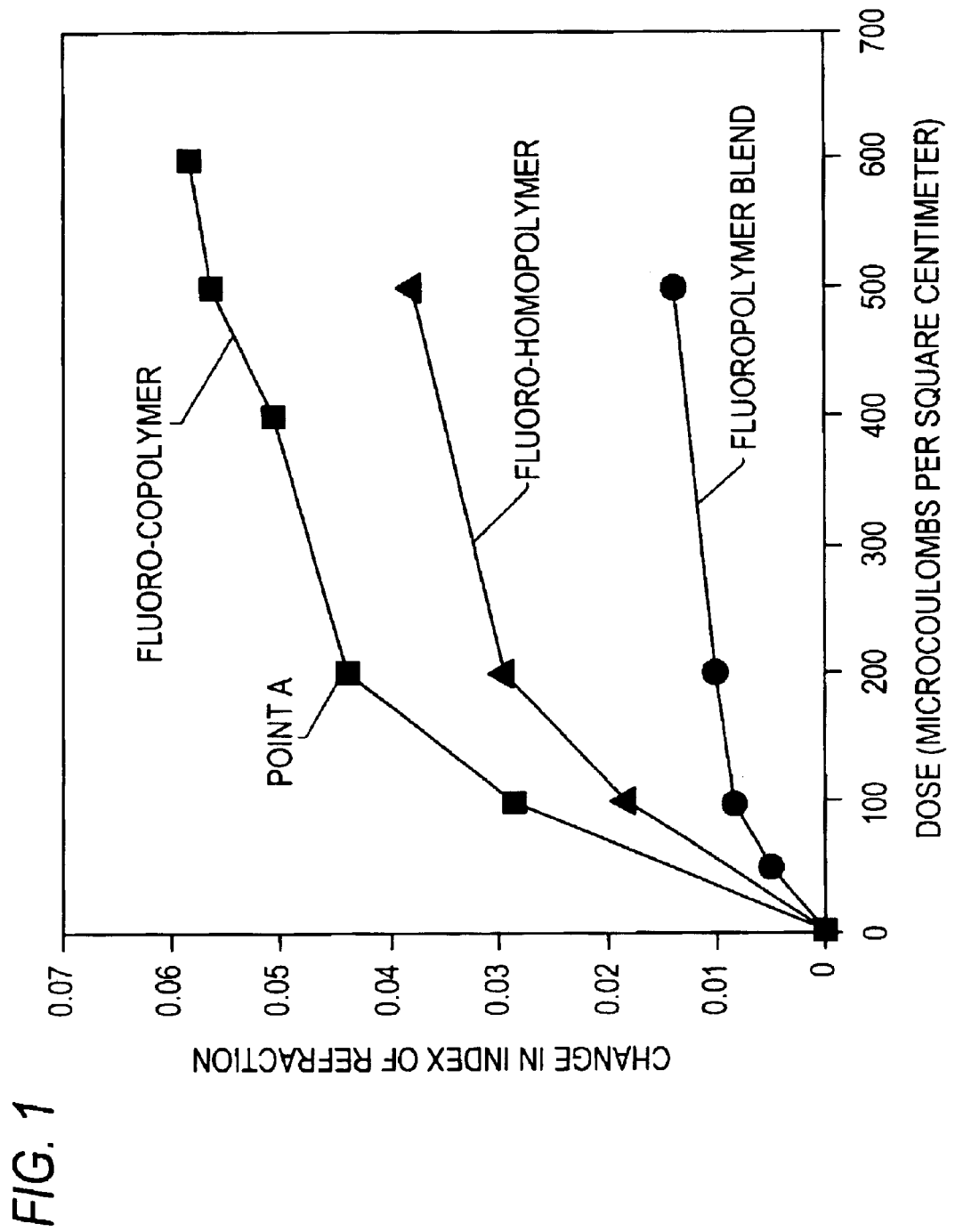
FIG. 1 shows a graph depicting the change in surface refractive index as a function of electron beam dosage while maintaining current and energy constant.
Figure 2:
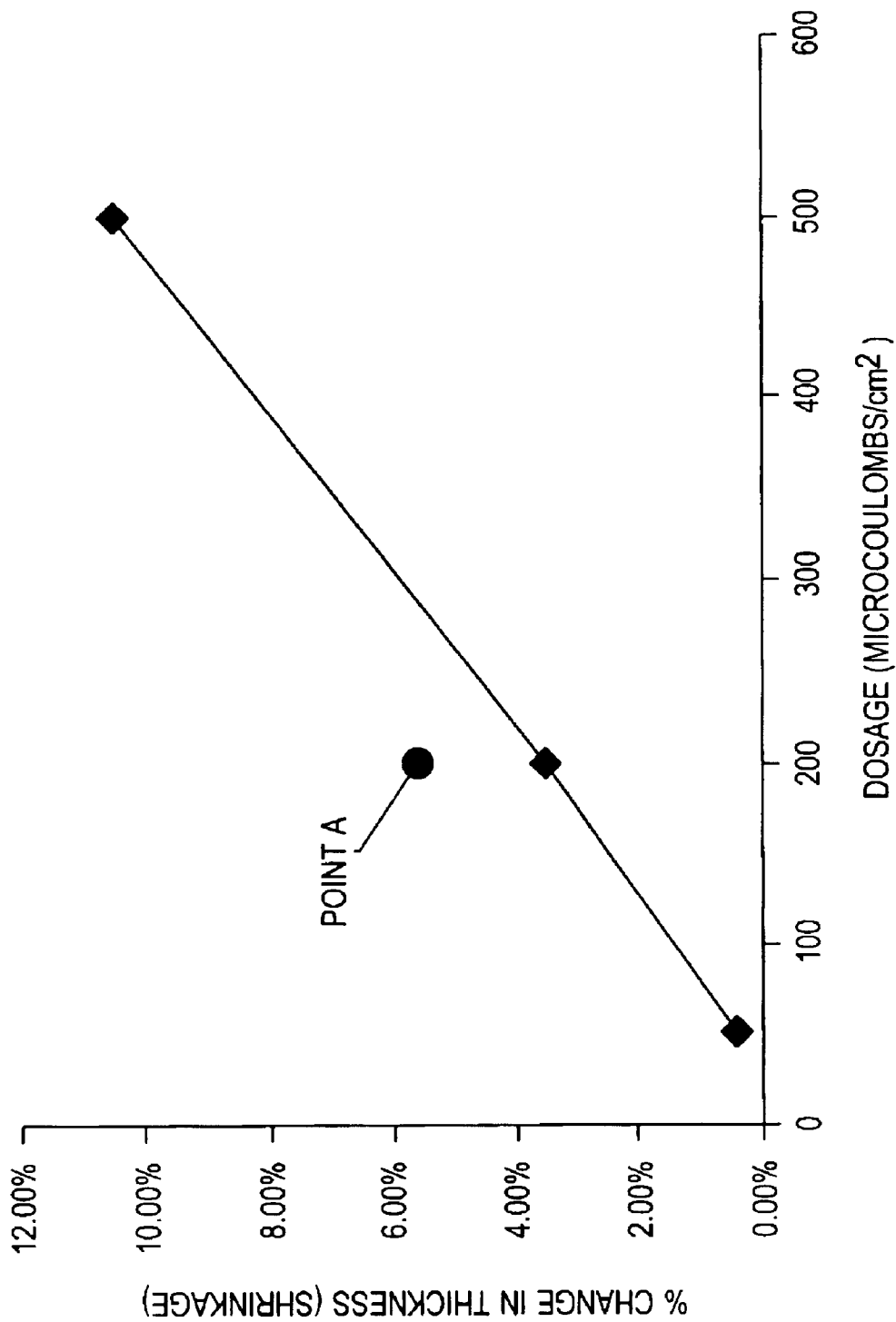
FIG. 2 shows a graph depicting the change in sample thickness as a function of electron beam dosage while maintaining current and energy constant.
Figure 3A:
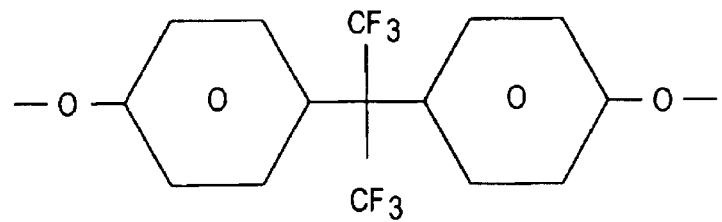
FIG. 3 schematically depicts in FIGS. 3A, 3B, 3C, 3D and 3E several aromatic chemical structures that can be used as starting materials.
Figure 3B:
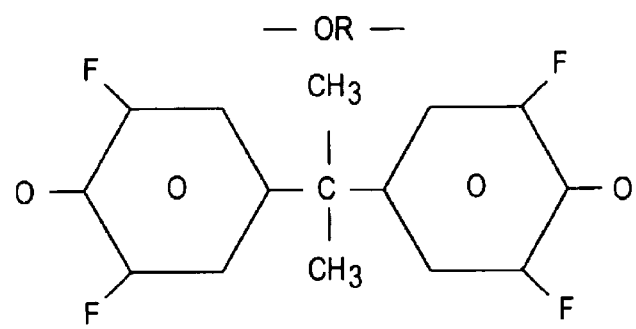
Figure 3C:
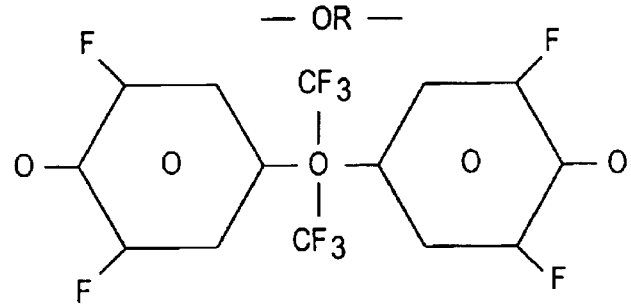
Figure 3D:
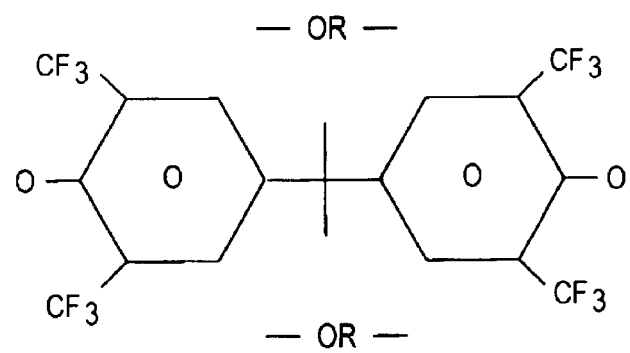
Figure 3E:
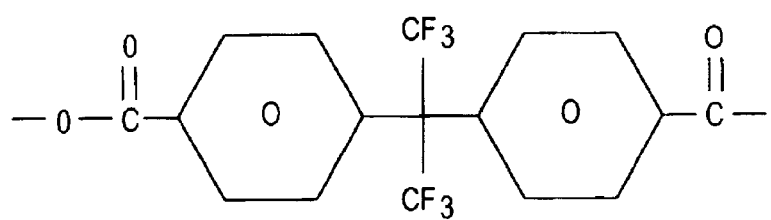

The exposure of selected optical materials to electron beam irradiation can convert the existing material into a new state which exhibits more desirable optical and mechanical properties not present in the un-irradiated material. An example of this can be seen in FIGS. 1 and 2 which shows a plot of surface refractive index as a function of electron dosage and overall thickness respectively in a uniformly irradiated sample as a function of electron dosage for several amorphous fluoropolymers. The new optical material was created only by exposure to the electron beam. The introduction of extra bonds within, in this case, a high polymer results not only in large index change but also results in insolubility in a solvent of the original (irradiated) materials. This conversion can be done selectively in 3 dimensions in either a continuous or periodic manner in normally non-reactive material systems including oil, waxes, monomers, oligomers, and high polymers such that a number of optically useful devices can be easily fabricated. Typically, the prior art method of forming a waveguide required the use of optical polymers containing photoinitiators, subtractive techniques such as reactive ion etching, or bonding dissimilar materials together with glue layers. In the first case, involving the use of photoinitiators because the wavelength of the radiation typically used to activate the photoinitiator systems creates near-field interference patterns (exhibiting textures on the order of the wavelengths trying to be propagated within the device) scattering losses results. These interference patterns are typically superimposed on the guiding structures used in splitters and other optical devices leading to bridging and striation within the films, all of which result in losses. The inventive use of electron beam processes eliminates interference effects since the equivalent wavelength (of the electron beam) is orders of magnitude less than typical optical exposure tools.

The electron beam imparts sufficient energy to the chemical bonds to create scissions, which leads to the formation of additional networking bonds as these reactive entities recombine within the material. The change in refractive index, and in some cases lower loss (higher optical transmission), is due to the process of scission and reformation and (to a lesser extent) due to the extraction of low molecular weight components that are volatilized by the e-beam that are removed by the vacuum system. Due to this dual process, conditions can be created in which the index of refraction can be higher or lower than the index of refraction of the starting material cured using conventional means. This allows a wide range of new materials to be selectively created having improved properties for optical applications.

Examples of the optical starting materials that can be converted using this approach include spin-on glasses, polymers, monomers, oligomers, waxes, and oils. These materials do not outgas significantly in soft vacuum (10–50 millitorr). Other optically useful materials include composites and mixtures including inorganic/organic suspensions, polymers containing organometallics, and sol-gels. Since the formation of bonds does not require an additive such as a photoinitiator, the range of available material blends is large.

A fluorinated wax exhibiting a melt point at 45° C. is an example of a material that can be formed into a new optical material. After irradiation, the newly formed clear layer does not flow or melt up to 100° C. Also, a fluorinated oil can be combined with a fluorinated diacrylate monomer as a starting material. After e-beam irradiation, a newly created material results that is a clear solid film exhibiting a much higher CF content (i.e. lower optical loss at 1.55 µm). This results from the additional bonding caused by the e-beam irradiation allowing two normally non-reactive materials to form a new optically useful material. Because the oil in this particular case is fully fluorinated, its addition to the fluorinated diacrylate leads to a material with a higher CF to CH ratio, which exhibits less absorption at 1.55 µm. As another example, the incorporation of UV opaque fillers has also been demonstrated. In this case, 5 nm FE2O3 particles were dispersed in fluorinated diacrylate monomer. After irradiation by e-beam, a non-scattering solid film was formed. All of these represent new optical materials that are created by this invention and are considered embodiments of this invention. Electron bleachable dyes are also embodied in this invention preferably for the formation of a black matrix in optical applications.

Preferred materials include the following: Typical spin-on glass materials include methylsiloxane, methylsilsesquioxane, phenylsiloxane, phenylsilsesquioxane, methylphenylsiloxane, methylphenylsilsesquioxane, and silicate polymers. Spin-on glass materials also include hydrogensiloxane polymers of the general formula $(H_{0-1.0}SiO_{1.5-2.0})_x$ and hydrogensilsesquioxane polymers, which have the formula $(HsiO_{1.5})_x$, where x is greater than about 8. Also included are copolymers of hydrogensilsesquioxane and alkoxyhydridosiloxane or hydroxyhydridosiloxane. Spin-on glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than 0 and the sum of n and m is greater than about 8 and R is alkyl or aryl.

Typical polymer materials include halogenated polyalkylenes, preferred fluorinated an/or chlorinated polyalkylens, more preferred chlorofluoropolyalkylens, and most preferred are the fluorinated polyalkylenes among which are included: polytetrafluoroethane (ethylene), polytrifluoroethylene, polyvinylidene fluoride, polyvinylfluoride, copolymers of fluorinated ethylene or fluorinated vinyl groups with non-fluorinated ethylenesor vinyl groups, and copolymers of fluorinated ethylenes and vinyls with straight or substituted cyclic fluoroethers containing one or more oxygens in the ring. Also included in the most preferred polymers are poly(fluorinated ethers) in which each linear monomer may contain from one to four carbon atoms between the ether oxygens and these carbons may be perfluorinated, monofluorinated, or not fluorinated.

Also included in the most preferred polymers are copolymers of wholly fluorinated alkylenes with fluorinated ethers, partly fluorinated alkylenes with wholly fluorinated ethers, wholly fluorinated alkylenes with partly fluorinated ethers, partly fluorinated alkylenes with partly fluorinated ethers, non-fluorinated alkylenes with wholly or partly fluorinated ethers, and non-fluorinated ethers with partly or wholly fluorinated alkylenes.

Also included among the most preferred polymers are copolymers of alkylenes and ethers in which one kind of the monomers is wholly or partly substituted with chlorine and the other monomer is substituted with fluorine atoms. In all the above, the chain terminal groups may be similar to those in the chain itself, or different.

Also among the most preferred polymers are included substituted polyacrylates, polymethacrylates, polyitaconates, polymaleates, and polyfumarates, and their copolymers, in which their substituted side chains are linear with 2 to 24 carbon atoms, and their carbon atoms are fully fluorinated except for the first one or two carbons near the carboxyl oxygen atom such as Fluoroacrylate, Fluoromethacrylate and Fluoroitaconate as shown is examples 1, 2 and 3 below:

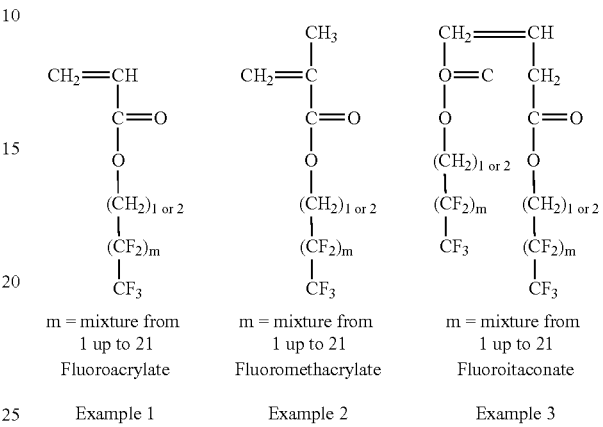

| Fluoroacrylate | Fluoromethacrylate | Fluoroitaconate |
| m = mixture from 1 up to 21 | m = mixture from 1 up to 21 | m = mixture from 1 up to 21 |
| Example 1 | Example 2 | Example 3 |

Among the more preferred polymers, one includes fluoro-substituted polystyrenes, in which the ring may be substituted by one or more fluorine atoms, or alternatively, the polystyrene backbone is substituted by up to 3 fluorine atoms per monomer. The ring substitution may be on ring carbons No. 4, 3, 2, 5, or 6, preferably on carbons No. 4 or 3. There may be up to 5 fluorine atoms substituting each ring.

Among the more preferred polymers, one includes aromatic polycarbonates, poly(ester-carbonates), polyamids and poly(esteramides), and their copolymers in which the aromatic groups are substituted directly by up to four fluorine atoms per ring one by one on more mono or trifluoromethyl groups such as shown in FIGS. 3A, 3B, 3C, 3D and 3E.

Among the more preferred polymers, are fluoro-substituted poly(amic acids) and their corresponding polyimides, which are obtained by dehydration and ring closure of the precursor poly(amic acids). The fluorine substitution is effected directly on the aromatic ring. Fluoro-substituted copolymers containing fluoro-substituted imide residues together with amide and/or ester residues are included.

Also among the more preferred polymers are parylenes, fluorinated and non-fluorinated poly(arylene ethers), for example the poly(arylene ether) available under the tradename FLARE™ from AlliedSignal Inc., and the polymeric material obtained from phenyl-ethynylated aromatic monomers and oligomers provided by Dow Chemical Company under the tradename SiLK™, among other materials.

In all the above, the copolymers may be random or block or mixtures thereof.

Figure 4:
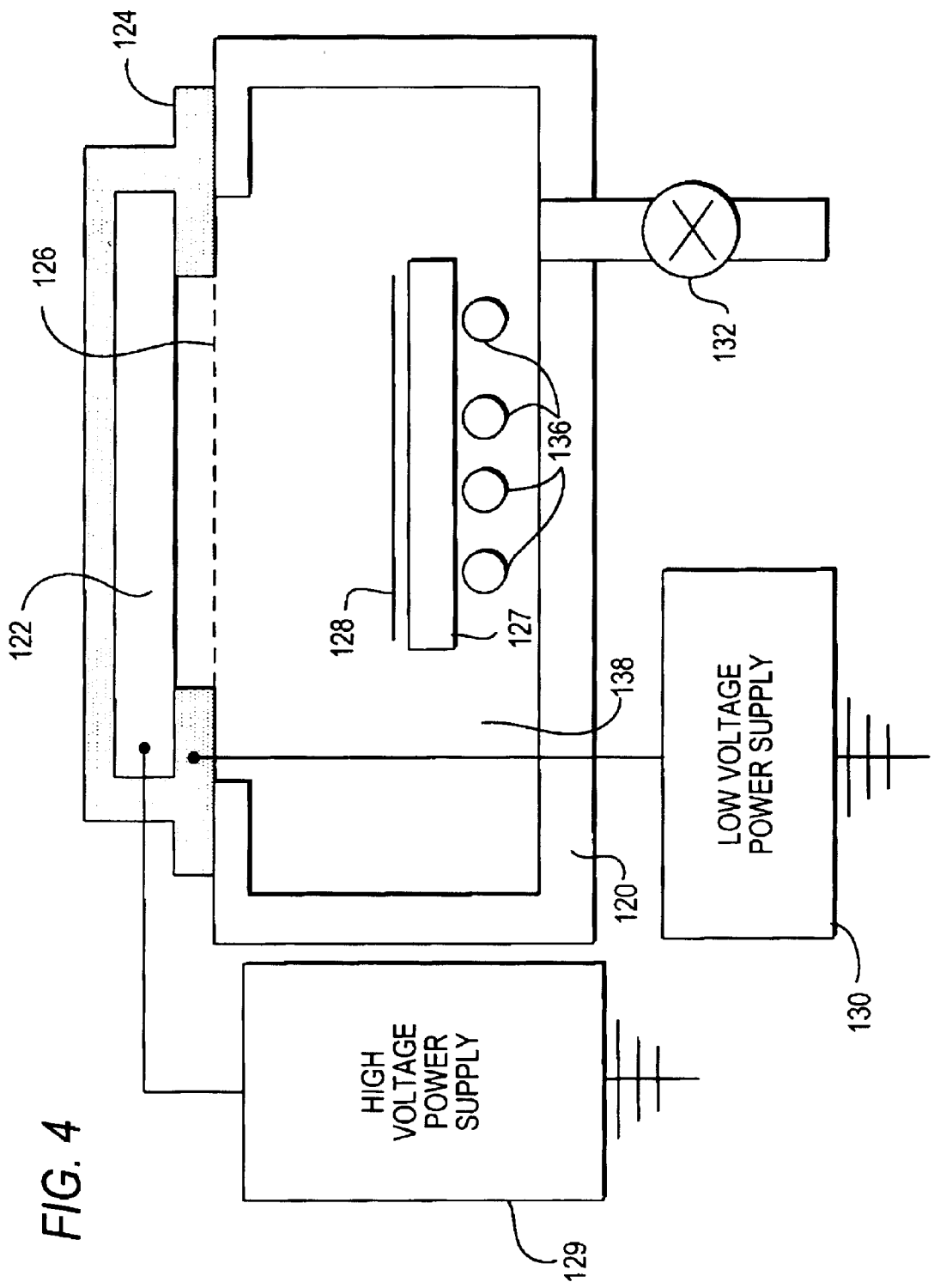
FIG. 4 shows a schematic view of a large area electron beam exposure apparatus.
Figure 5:
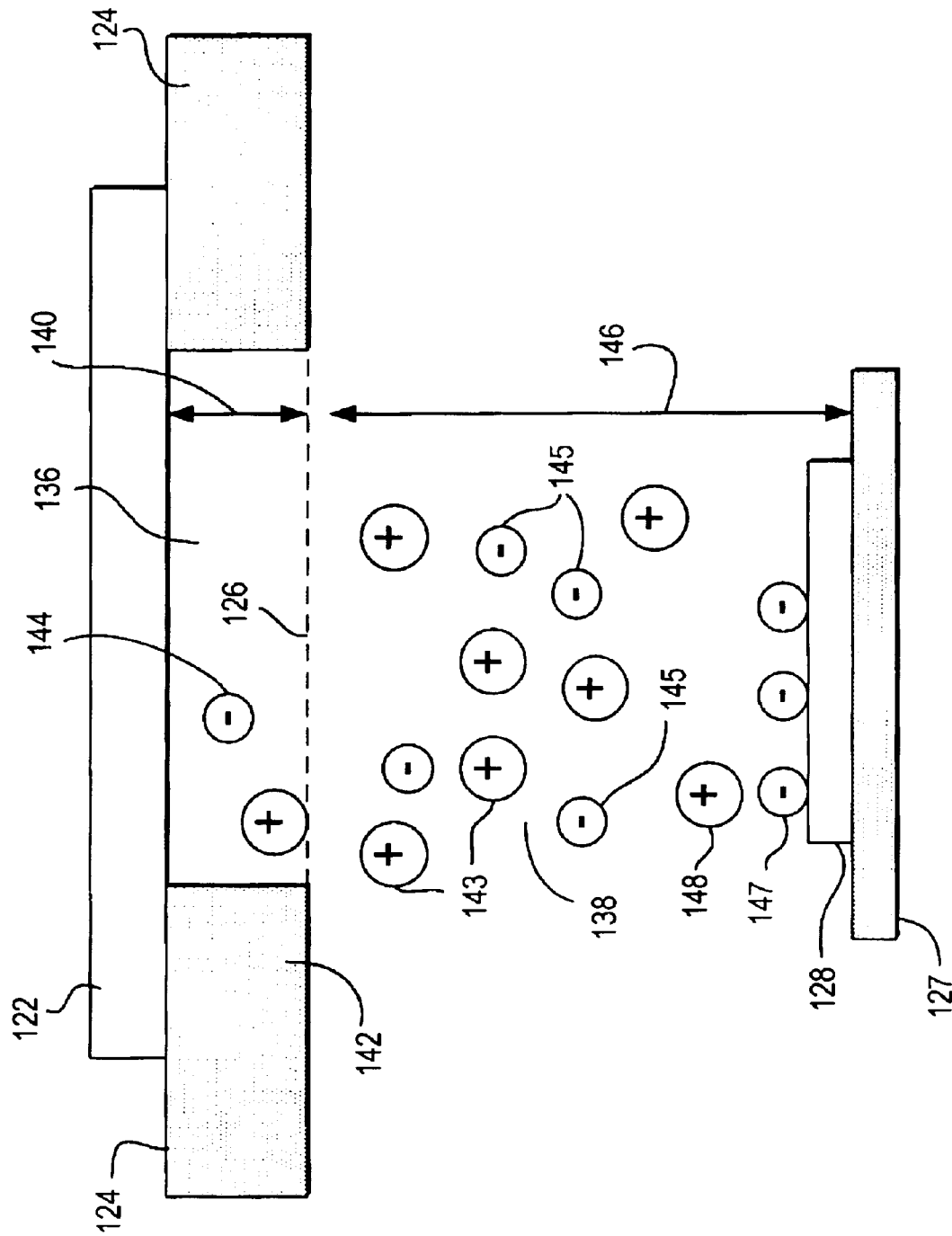
FIG. 5 shows the operation of the electron source.

The method of creating new optical materials from these conventional spin-on glass and polymer materials, according to the present invention, is depicted in FIGS. 4 and 5. A substrate 127 is placed in a vacuum chamber 120 at a pressure of 15–40 millitorr and underneath an electron source at a distance from the source sufficient for the electrons to generate ions in their transit between the source and the substrate surface. The electrons can be generated from any type of source that will work within a soft vacuum (15–40 milliTorr) environment. A source particularly well suited for this is described in U.S. Pat. No. 5,003,178, the disclosure of which is hereby incorporated into this specification by reference. This is a large uniform and stable source that can operate in a soft vacuum environment. The cathode 122 emits electrons, and these are accelerated in the field region 136 for a distance 140 between the cathode and anode 126. The potential between these two electrodes is generated by the high voltage supply 129 applied to the cathode 122 and the bias voltage supply 130 applied to the anode 126. A high voltage insulator 124 isolates the anode 126 from the cathode 122. The electrons irradiate the starting optical material layer 128 coated on the substrate 127. The starting optical material layer 128 may be any of the materials previously mentioned or the spin-on glass or polymer materials described above. An electron energy is selected to either fully penetrate or partially penetrate the full thickness of starting optical material layer 128. For example, an electron beam energy of 9 keV is used to penetrate a 6000.ANG. thick film. Quartz lamps 136 irradiate the bottom side of the substrate providing heating independent from the electron beam. A variable leak valve or mass flow controller, identified by reference 132, is utilized to leak in a suitable gas to maintain the soft vacuum environment.

Referring to FIG. 5, electrons 145 traversing the distance 146 between the anode 126 and the substrate 127 ionize the gas molecules located in region 138 generating positive ions. These positive ions 143 are then attracted back to the anode 126 where they can be accelerated, as indicated at 142, toward the cathode to generate more electrons. Upon striking the cathode surface these high energy ions 143 produce secondary electrons 144 which are accelerated back toward the anode 126. The dielectric film 128 on the substrate 127 is an insulator and will begin to charge negatively, as indicated at 147, under electron bombardment. However, the positive ions 148 near the substrate surface will be attracted to this negative charge and will then neutralize it. The lamps 136 (FIG. 4) irradiate and heat the wafer or substrate thereby controlling its temperature. Since the wafer is in a vacuum environment and thermally isolated, the wafer can be heated or cooled by radiation. If the lamps are extinguished, the wafer will radiate away its heat to the surrounding surfaces and gently cool. In one embodiment of the invention, the wafer is simultaneously heated by the infrared lamps and irradiated by the electron beam throughout the entire process.

In the present method, a solution containing a spin-on glass or polymer material is deposited on substrate 127 by conventional means such as spin-coating or, alternatively, spray-coating or dip-coating to form dielectric layer 128. Substrate 127 represents any layer or stack of layers on a multiple-optical layer device. The coated substrate is continuously irradiated with electrons until a sufficient dose has accumulated to attain the desired change in the material and affect certain film properties such as refractive index, resistance to etchant chemicals, and density. A total dose of between 10 and 100,000 microCoulombs per square centimeter ($\mu C/cm^2$) may be used. Preferably, a dose of between 100 and 10,000 $\mu C/cm^2$ is used, and most preferably a dose of between about 2,000 and 5,000 $\mu C/cm^2$ is used. The electron beam is delivered at an energy of between 0.1 and 100 keV, preferably between 0.5 and 20 keV, and most preferably at an energy between 1 and 10 keV. The electron beam current ranges between 0.1 and 100 mA, and more preferably between 0.25 and 30 mA. The entire electron dose may be delivered at a single voltage. Alternatively, particularly for films thicker than about 0.25 µm, the dose is divided into steps of decreasing voltage, which provides a "uniform dose" process in which the material is irradiated from the bottom up. The higher energy electrons penetrate deeper into the film. In this way, the depth of electron beam penetration is varied during the electron exposure process resulting in a uniform energy distribution throughout the film. The variation allows for volatile components, such as solvent residues, to leave the film without causing any damage such as pinholes or cracks. This also attains uniform optical index throughout the layer exposed. Alternatively, the electron energy can be varied to achieve a precise dose and index change spatially within the material.

During the electron beam exposure process, the wafer is kept at a temperature between 10° C. and 1000° C. Preferably, the wafer temperature is between 30° C. and 500° C. and most preferably between 200° C. and 400° C. For some waxes and other low melting point materials low temperatures are utilized (25°–175°). The infrared quartz lamps are on continuously until the wafer temperature reaches the desired process temperature. The lamps are turned off and on at varying duty cycle to control the wafer temperature. Typical background process gases in the soft vacuum environment include nitrogen, argon, oxygen, ammonia, forming gas, helium, methane, hydrogen, silane, and mixtures thereof. For many starting optical materials, a non-oxidizing processing atmosphere is used. For other applications, such as complete conversion of siloxane material to silicon dioxide, an oxidizing atmosphere would be appropriate. The optimal choice of electron beam dose, energy, current, processing temperature, and process gas depends on the composition of the starting optical material, spin-on glasses or polymer material.

The optical starting material may be deposited onto a suitable substrate. Typical substrates include glass, silicon, metal, and polymer films. Substrates can also be porous, textured or embossed. Deposition on substrates may be conducted via conventional spin coating, dip coating, roller coating, spraying, embossing, chemical vapor deposition methods, or meniscus coating methods, which are well known in the art. Spin coating on substrates is most preferred. Multiple layers of different materials are also preferred. Layer thicknesses typically range from 0.01 to 20 microns. 1 to 10 microns is preferred. In another embodiment of the invention, the optical starting material is formed into a supported film similar to pellicles used in semiconductor applications. In this case, films may be formed by casting, spin coating, and dip coating, lifted off the substrate and attached to a frame for handling. In addition, extruded films can be attached to a frame, all of which are well known in the art. Casting, with lift-off and frame attachment is preferred. Single layered films exhibit thicknesses ranging from 1 micron to 10 microns. Multiple layers of different materials are also possible. Once the article has been formed, the exposure equipment needs to be selected.

Exposure of the material can be done with any type of low energy electron source, preferably in the range of 1 to 50 Kv. Soft vacuum (15–40 millitorr) is also preferred for removal of volatiles and usage of low Kv electrons. In the preferred embodiment of this invention, the optically useful material, either on a substrate or as supported film, is selectively exposed to the electron beam and heated using the IR lamps. Selective heating is also preferred. The IR lamps typically operate from room temperature to 400° C. Most materials exhibit different e-beam irradiation responses depending on the temperature of the material. In addition, post annealing can eliminate charge gradients in electrodes formed during irradiation. In-situ monitoring of the exposure process is included in this invention such as monitoring grating spectral response concerning side lobes during exposure. Other functions such as transmission loss, polarization sensitivity, and back reflections can all be monitored during exposure and used in a feedback loop to the exposure parameters. In-situ feedback during exposure is an embodiment of this invention. Various gases can be introduced during the irradiation process. It has been shown that these gases can be reacted into the sample depending on the material and exposure conditions. Introduction of a reactive or non-reactive gas into the film during exposure is a further embodiment of this invention. Radial exposure conditions, as well as other non-flat configurations, are embodiments of this invention as well as modification of the electron field using external means such as magnetic fields. Once the equipment is selected, the exposure conditions are selected.

Figure 6A:
FIG. 6 shows a schematic view of representative embossed structures 6A, 6B and 6C.
Figure 6B:
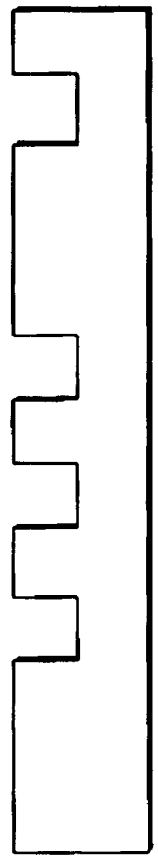
Figure 6C:
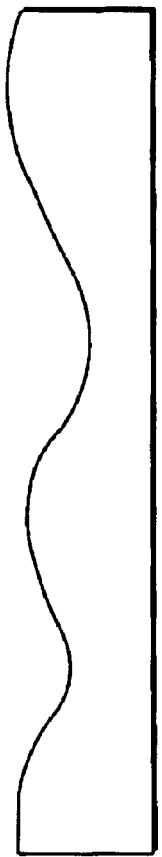

Typically the optically useful material is exposed to a sequential series of kinetic energies generating a particular distribution of bond densities within the optically useful material. Based on the material's particular e-beam response, temperature distribution within the material, kinetic energy distribution of the electrons, and density of the material, a range of new material states can be generated. These new material states exhibit properties not available in the un-irradiated state. Preferred property changes include 3 dimensional complex index of refraction (including birefringence), scatter losses, reduction in intrinsic loss by removal of —OH, —CH, —C and other absorption groups, stress birefringence, modification of the melting point (Tm) in waxes, modification of glass transition temperature (Tg), change or elimination of solubility, increase or decrease in surface energy and adhesion. Exposure can be done through an aperture mask as known in the art or by embossing or forming an absorptive mask directly on the sample or on a thin carrier film support above the sample. In the case of films, dual sided processing can be used. The mask can be either sacrificial or permanent depending on the application. In this embodiment of the invention, rather than forming a binary system a gradient of exposure can be generated. As shown in FIG. 6, a variety of structures can be formed using embossing or photolithography steps known in the art. During exposure the areas covered by the mask would proportionally absorb electrons as a function of the embossed thickness. As stated earlier, both the dosage and energy distribution is affected by this approach. But it has been demonstrated that a variety of gradient structures can be generated using this patterning technique and a number of the examples include this approach. In addition, because the sample or a thin membrane supports the mask multiple sequential masks are not required. An additional technique that can be used is where backscatter off a patterned high z (atom number) material is used. In the case of embossed or textured starting materials, the need for a mask can be totally eliminated. The embossed structure is irradiated such that the penetration depth is less than feature height. The result is a region of higher index on pedestal after overcoating the resulting waveguide structure appears. In addition, a waveguide can be created on a grating surface. Because the irradiation condition determines the penetration depth, the resulting waveguide will follow the rapid modulation in the grating. Multiple layered configurations are also embodiments of this invention and will be shown in some of the following examples as will the use of this technique to couple closely spaced waveguides and other optical devices.

A further embodiment involves the use of the proximity effect to directly form tapered waveguides. Due to spreading as a function a depth that occurs, an array of micro-optical waveguides can be formed in a film. Once the sample is exposed, fabrication into a device can commence.

Figure 7:
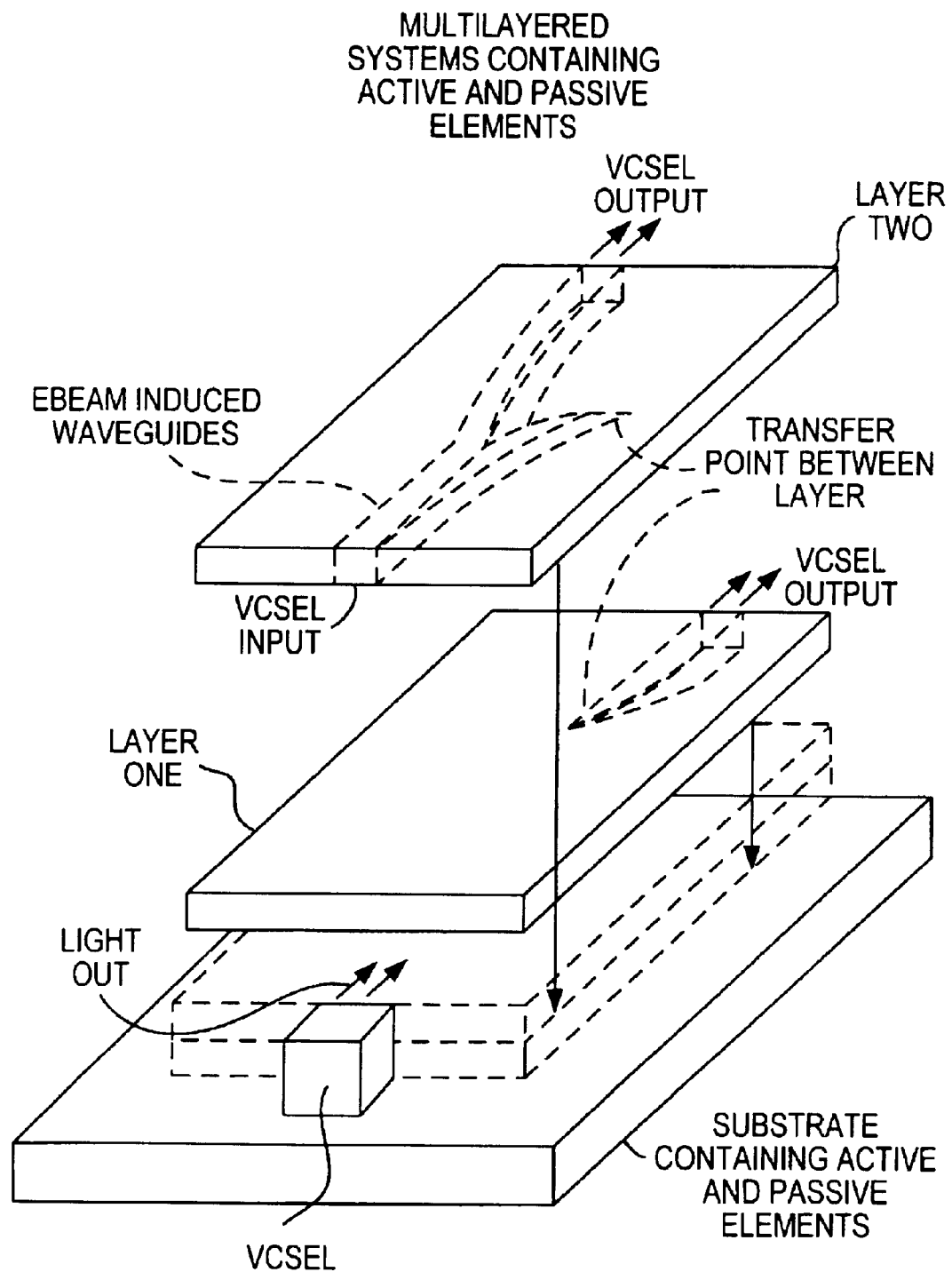
FIG. 7 shows an isometric view of representative multi-layered applications of the invention.

A further embodiment of this invention involves the layering of multiple films to form complex optical interconnects as shown in FIG. 7. FIG. 7 illustrates two optical layers being attached to a substrate containing an edge emitting laser diode. In this particular case, the laser diode is mounted such that light is coupled into the top layer while the bottom layer acts as a spacer to physically set the top layer at the appropriate height. The light emitted by the laser diode couples into the waveguide as is illustrated by the dashed lines in the top layer. Halfway through the layer, the waveguide splits into two branches, one which continues within the top layer and a second branch which transitions into the bottom layer. This transition can be created by varying the penetration depth. A mating pattern in the bottom layer can be formed in a similar manner. In this way, an optical interconnect can be fashioned allowing for complex 3 dimensional elements. In addition, the use of these films as overlays on active components such as microprocessors, Vertical Cavity Simulated Emission Lasers (VCSELs), laser diodes, and Micro-Electro-Mechanical Systems (MEMS) devices are also embodied. Lift off techniques using soluble or meltable temporary attachment means are also embodied in this invention. In the case of either a lifted off film or the supported film, attachment to non-flat substrates and incorporation into or on a printed circuit board is also embodied in this invention. Combinations with optical components such as prisms, gratings, waveplates and optical amplifiers are also embodiments of this invention.

Individual and combinations of the above mentioned embodiments are considered embodiments of this invention.

A preferred embodiment is where a layer of optically useful material is coated on a silicon wafer and selectively exposed to the e-beam using a mask (aperture, embossed absorptive mask) to provide an index profile within the optical starting material to form a waveguide. This profile can be fairly binary if several kinetic energy exposures are used to create a uniform energy distribution within the material. In this case, a fairly discrete boundary would exist between the two material states, and the new state would be fairly uniform in structure. In another embodiment of the invention, a single or very non-uniform energy distribution would be used creating a gradient of material states which would lead to a gradient index in the device.

In another embodiment, a film of optically useful material is supported by a frame where the film thickness corresponds to the core dimension required for an optical waveguide. The film is selectively exposed using a mask (aperture, embossed absorptive mask). An index profile is generated in the film as above to create a film having a thickness of the desired core with regions of higher index and lower index. Subsequent layering of cladding layers or other core/cladding layers allows for high density optical interconnects to be fabricated. In addition, introduction of active layers, use as overlays on MEMS and VCSELS arrays also represent embodiments of this invention.

Specific Material Formation Examples
Conversion of High Polymers

Two different amorphous fluoropolymer resins are exposed to varying dosages under the same kinetic energy distribution and current. FIG. 8 illustrates the change in surface refractive index as a function of dosage for the two materials as measured using a Metricon at 633 nm. In both cases, fairly low dosages of electron beam irradiation (25–200 $\mu C/cm^2$) leads to large changes in the surface refractive indices. In addition, a linear response region is present and is an embodiment of this invention. FIG. 9 illustrates the calculated thickness change as a function of dosage for the same kinetic energy distribution and current. Point A on FIG. 9 shows the effect of reduced current on shrinkage rate for these materials. This reduced shrinkage, however, still exhibited the same refractive index as the higher current condition. The shrinkage may be due in part to the network and in part to removal of low molecular weight volatiles, which may explain this result. In any case, the resulting material clearly has significantly modified properties.

Conversion of Liquids Exhibiting Reasonable Vapor Pressures

Figure 10A:
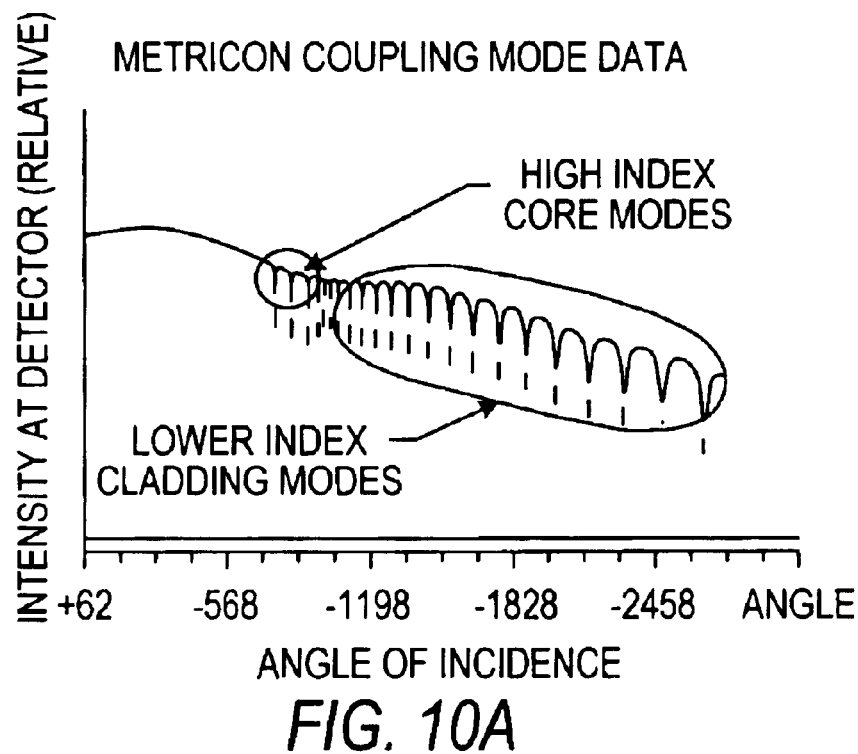
FIG. 10 shows graphically in FIGS. 10A and 10B the mode measured by the Metricon 2010 Prism coupler and the predicted gradient within the sample based on the measurement.
Figure 10B:
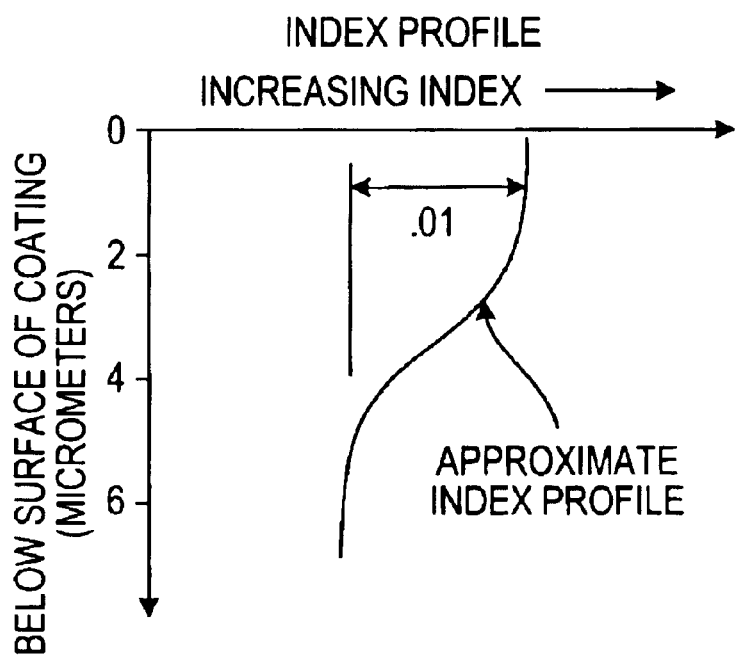

A fluorinated diacrylate monomer is coated 8 microns thick on a silicon wafer and is exposed to a large area (200 millimeter diameter) electron beam source operating at 28 Kv, 0.25 ma and 50 $\mu C/cm^2$ in a 12 millitorr nitrogen environment. The liquid exhibits sufficiently high vapor pressure to allow processing. Subsequently, a second exposure of a large area (200 millimeter diameter) electron beam source operating at 15 Kv, 0.25 ma and 50 $\mu C/cm^2$ is done resulting in the formation of a high index layer on top of the previously modified layer. Measurements done using a Metricon at 633 nm are shown in FIG. 10. The dual nature of mode structure clearly indicates a gradient nature, which is illustrated in FIG. 10.

Elimination of Melt Points in Fluorinated Waxes

An opaque perfluorinated wax is melted onto a silicon wafer, the wax exhibits a melt point of 43° C., and is subsequently exposed to a large area (200 millimeter diameter) electron beam source operating at 28 Kv, 0.25 ma and 100 $\mu C/cm^2$. After irradiation, the sample was placed upon a hot plate and heated to 100° C. The resulting material was optically clear and did not melt or flow at this elevated temperature.

Specific Methods and Applications Examples

Figure 11A:
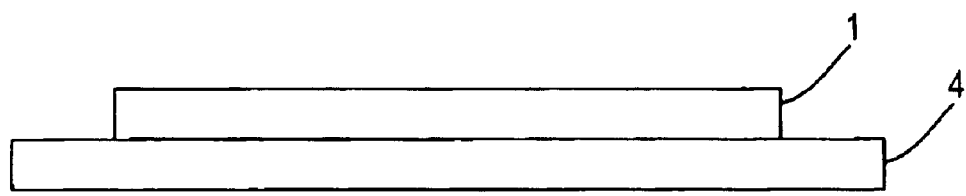
FIG. 11 shows in FIGS. 11A, 11B, 11C and 11D schematic views of forming a waveguide within a fluoropolymer.
Figure 11B:
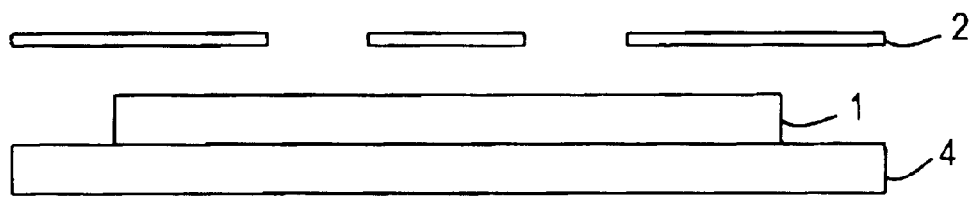
Figure 11C:
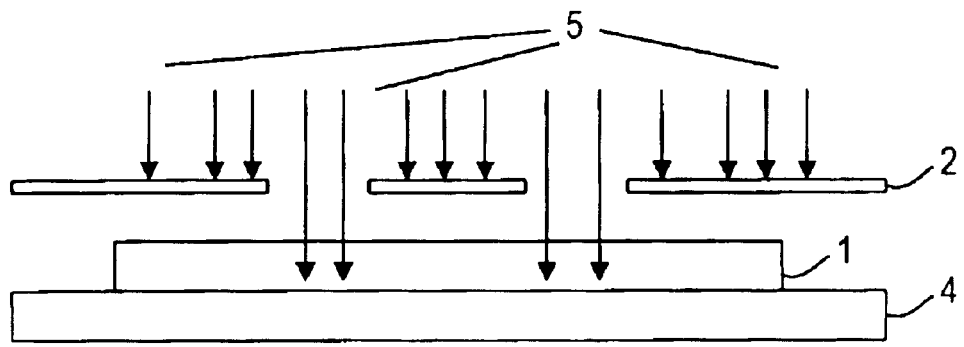
Figure 11D:
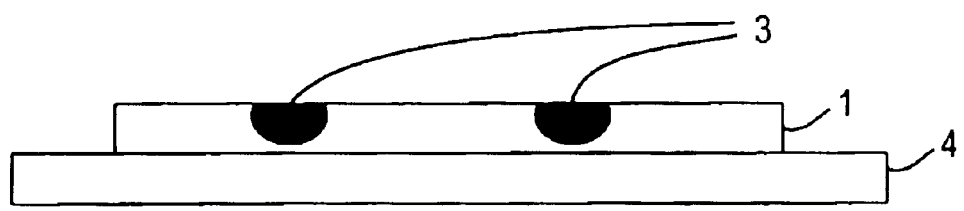
Figure 12:
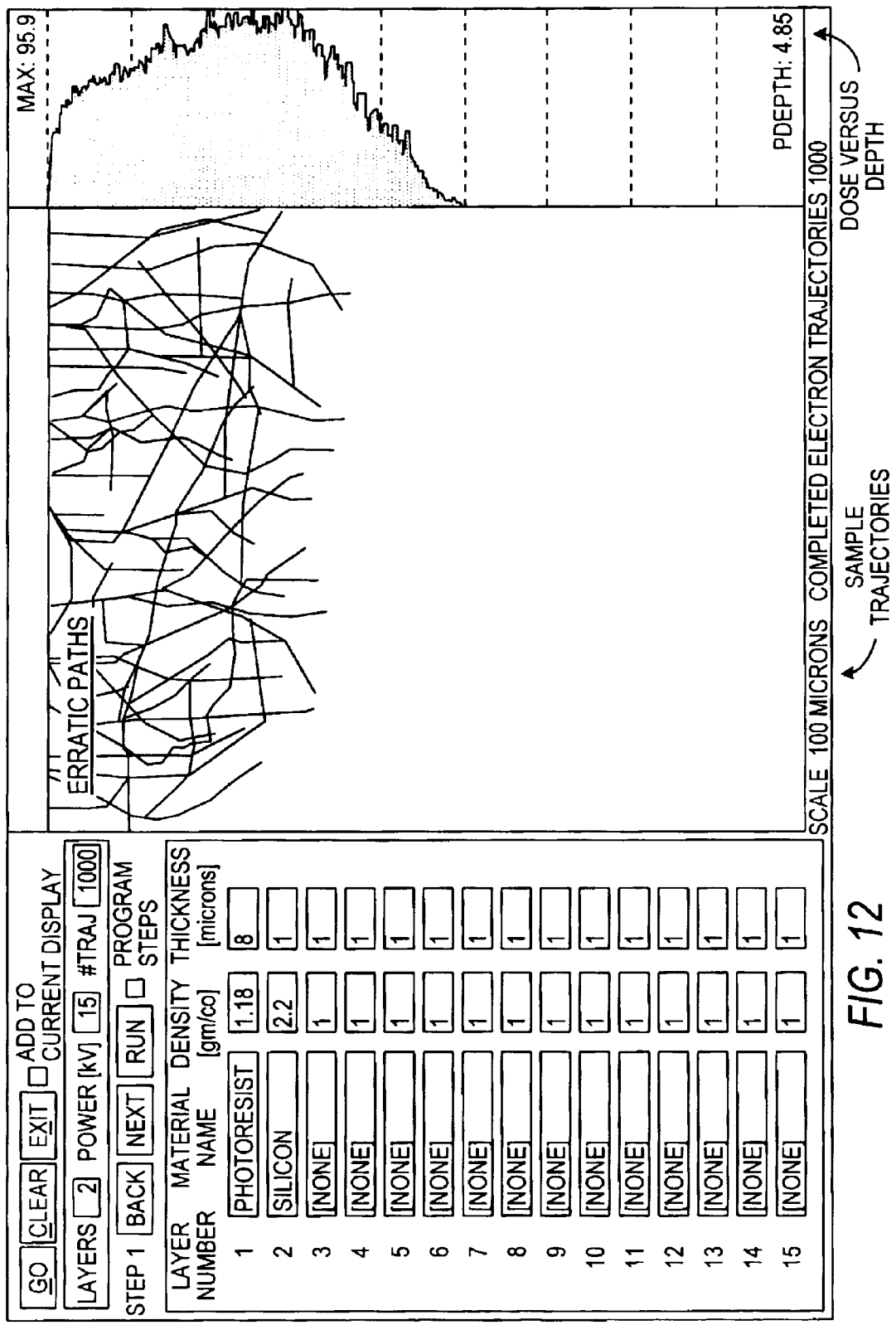
FIG. 12 shows a schematic view of the energy distribution within the fluoropolymer.

As shown in FIG. 11A, a silicon wafer 4 is spin-coated with an amorphous fluoropolymer such as Dupont Teflon AF, out of an appropriate solvent and dried resulting in an 8 μm layer of coating 1. In FIG. 11B, an aperture mask 2 is placed between the electron source and the coating 1 thereby restricting the electrons spatially. In FIG. 11C, electrons 5 are generated having exposure settings of 15 Kv exposure at 0.25 ma with a dose of 50 $\mu C/cm^2$. FIG. 11D shows that the coating 1 is converted in the exposed region to an amorphous fluoropolymer 3 having a surface index of refraction increase of 0.01 over that of the starting amorphous fluoropolymer coating 1. The calculated energy profile as a function of depth is shown in FIG. 12. This profile has been shown to create an approximately radial index gradient within the guide. This then creates a core/cladding condition sufficient for waveguiding with radially graded index change between 1 and 3. Upon examination using a Metricon, two modes are found at 633 nm. This is readily visible in the sample during testing within the Metricon. As the instrument scans the incident beam through its range of angles, laser light is clearly waveguided to the edge of the coated wafer leading to highly visible red spots (of the metricon laser) along the edge of the wafer.

In FIG. 13A, a glass slide 9 is spin coated with a spin-on glass, such as Honeywell 512B, forming a 1.5 μm coating 8 after solvent bake out. In FIG. 13B, the coating 8 and slide 9 is simultaneously irradiated using electron beam 7 generating 20 Kv 10 ma and 5000 $\mu C/cm^2$ and heated to 300° C. generated using IR heating 10 while the slide 9 is tilted at 15 degrees to the electron beam 7 through an aperture mask 11. In FIG. 13C the assembly is further cured using thermal furnace techniques known in the art resulting in a tilted gradient 6 that is embedded in the spin-on coating 8 creating an output coupling device. In this case, the tilted gradient 6 exhibits a lower index of refraction near the glass slide 9 and then increases to a level exceeding the surrounding thermally cured coating 8. Light propagating within the glass slide will be extracted by the tilted gradient 6.

Figure 14A:
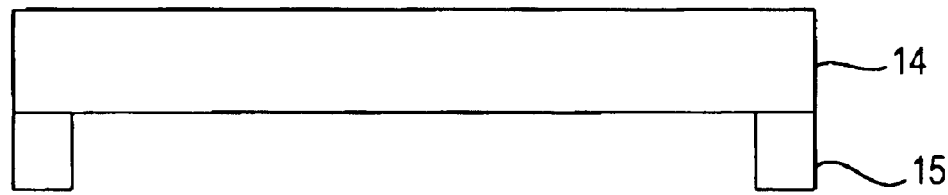
FIG. 14 shows in FIGS. 14A, 14B and 14C schematic views of generating gradients with supported films using embossed masks.
Figure 14B:
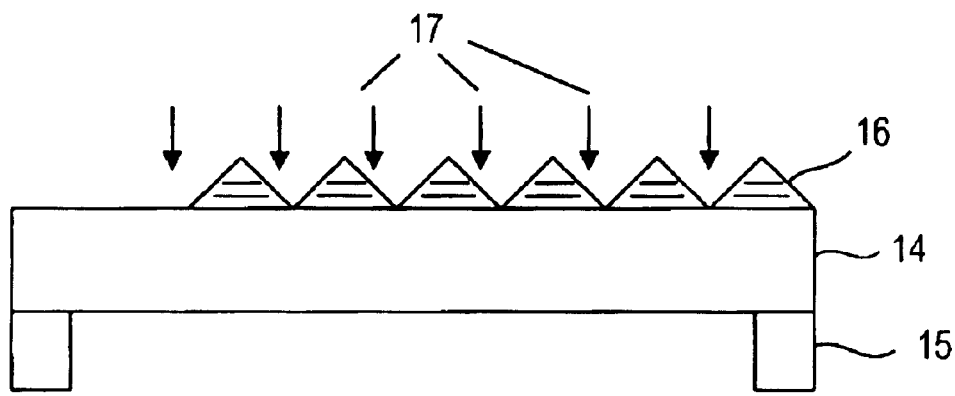
Figure 14C:
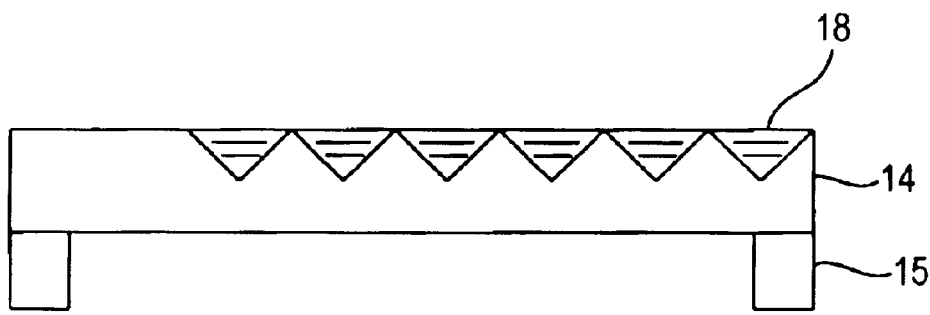

In FIG. 14A, a 5 micron film of nitrocellulose 14 is adhesively mounted on a support ring 15. In FIG. 14B, an electron beam 17 generating a 28 Kv exposure at 0.25 ma with a dose 50 $\mu C/cm^2$ is done through an embossed structure 16 consisting of 10 μm tall 120 degree included angle linear prisms on a 30 μm pitch created in a fluorinated low temperature wax. After exposure, FIG. 14C shows that the embossed structure 16 can be removed resulting in a flat film of nitrocellulose 14 containing an index gradient pattern 18 as shown. Due to the variable thickness of the embossed structure 16 a varying exposure dosage and kinetic energy range is absorbed with the nitrocellulose film 14. In this case, collimated incident light will be split into multiple beams determined by the index gradient pattern 18.

Figure 15A:
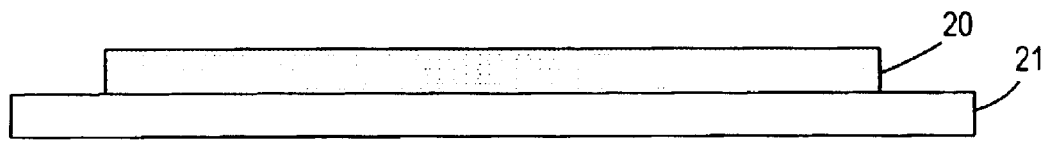
FIG. 15 shows in FIGS. 15A, 15B and 15C schematic views of modification of crystallinity with Aclar exposed above its melt point.
Figure 15B:
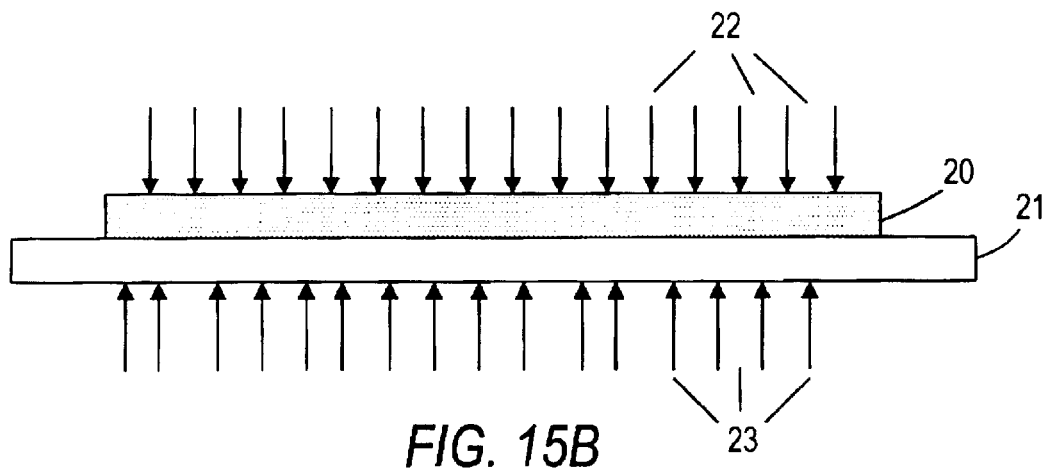
Figure 15C:

In FIG. 15A, an 11 micron film 20 of extruded CTFE, such as Honeywell Aclar, is adhered to silicon wafer 21. In FIG. 15B, the film 20 is exposed using an electron beam 22 generating 28 Kv at 1 ma, and a dose of 400 $\mu C/cm^2$. Also, the silicon wafer 21 and film 20 is elevated to just above its melt temperature by the IR source 23. FIG. 15C shows the sample removed from the chamber, and the resulting optical material 24 exhibits less haze (light scattering) than the original film 20 that was only exposed to the IR source 23 and raised to the same temperature.

In another example, a 5 micron film of amorphous fluoropolymer, such as Hyflon AD trademarked by Ausimont, is adhesively bonded to a support ring as known in the art. The film can be wetted to a silicon wafer using an amide functionalized fluorinated oil exhibiting a vapor pressure sufficiently to allow processing at 15 millitorr without significant outgassing. An aperture mask is placed over the sample and an electron beam generates an exposure of 28 kV at 0.25 ma for a dose of 100 $\mu C/cm^2$. The sample is removed and rinsed using a normal solvent as known in the art, and a optically useful layer 3 several microns thick is attached to the backside of film in the exposed areas. In this example the thickness of the fluorinated oil is unimportant as the electron beam kinetic energy determines the penetration depth into the fluorinated oil. As long as the film has a known thickness, the resulting optically useful layer thickness can be controlled.

Figure 16A:
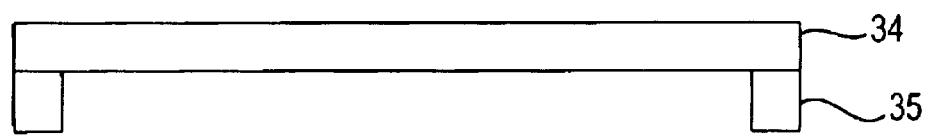
FIG. 16 shows in FIGS. 16A, 16B, 16C and 16D schematic views of sequential exposures creating binary structures within a polyimide film.
Figure 16B:
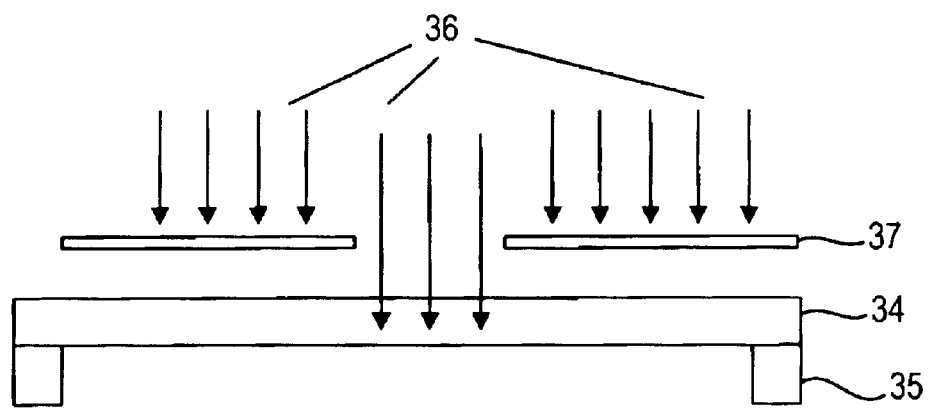
Figure 16C:
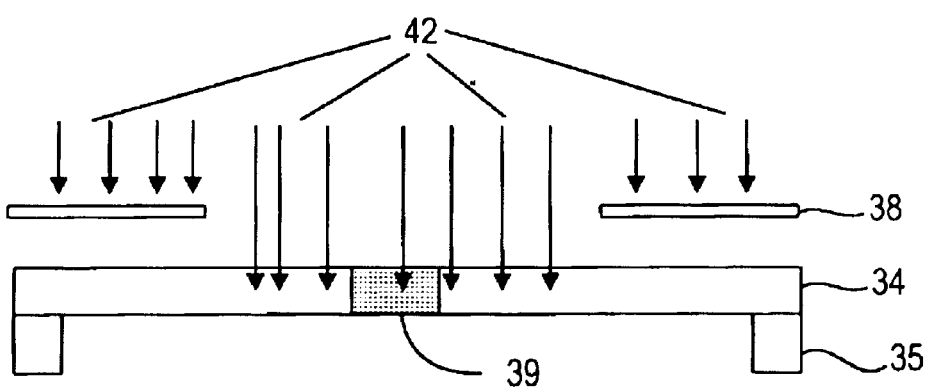
Figure 16D:
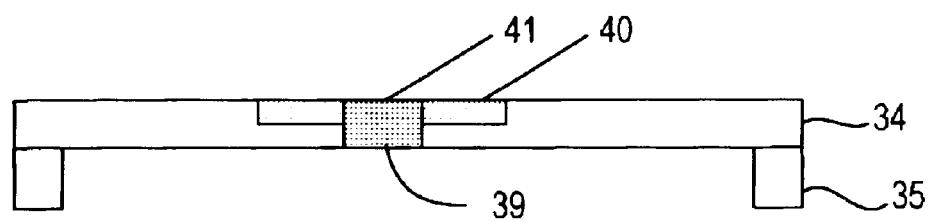

In FIG. 16A, a 5 micron film 34 of fluorinated polyimide is adhesively bonded to a support ring 35. FIG. 16B shows a 28 Kv electron beam 36 irradiating the film 34 through an aperture mask 37 such that a fairly uniform exposure occurs throughout the thickness of the film 34. In FIG. 16C the film 34 is re-exposed using a 10 Kv electron beam 42 through an aperture mask 38 where the previously exposed area 39 is also re-exposed as well as additional areas 40 and 41. FIG. 16D illustrates how the film 34 now contains multiple levels of index change, the previously exposed area 39, and the additional areas 40 and 41 where additional area 41 represents a region of double exposure. This sequential exposure through different masks generates a gradient approximating a two level binary optic.

Figure 17A:
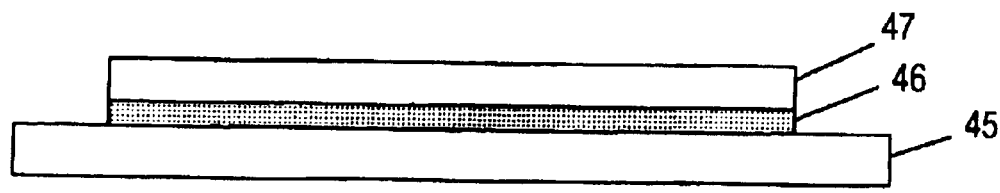
FIG. 17 shows in FIGS. 17A, 17B, 17C and 17D schematic views of forming gradients within spin on glasses with a releasable layer.
Figure 17B:
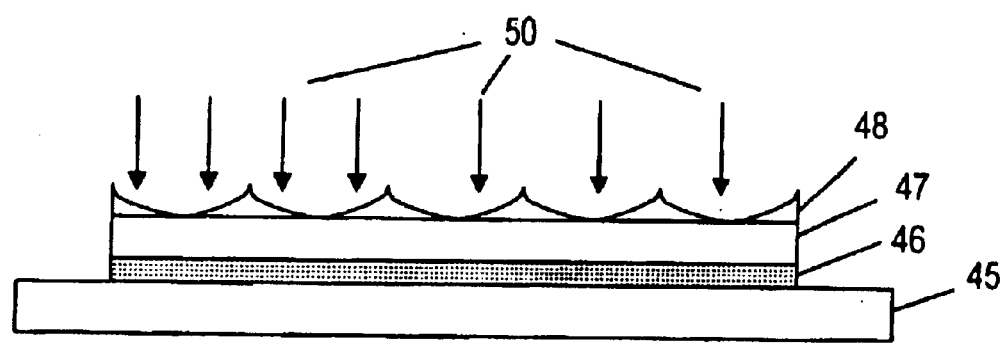
Figure 17C:
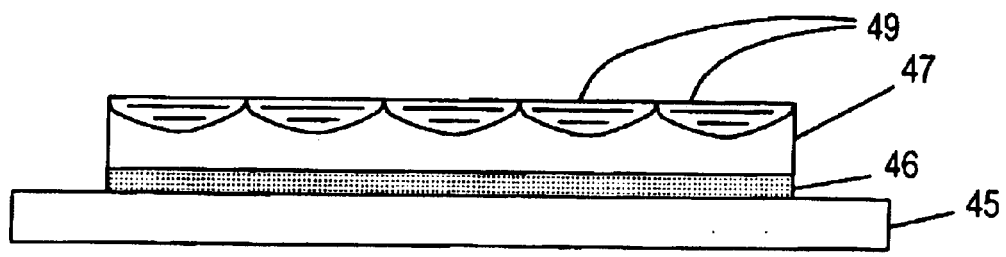
Figure 17D:

In FIG. 17A, a 4 micron layer of spin-on glass 47 is coated on a release film 46 attached to a silicon wafer 45 using multiple spin coats known in the art and baked to remove solvent. After drying, FIG. 17B shows a microlens structure 48 being formed in a photoresist on the surface of the spin-on glass layer 47; this assembly is irradiated an electron beam 50. FIG. 17C shows that the microlens structure 48 can be removed from the spin-on glass layer 47 but regions of gradient 49 remain which can approximate a microlens array. In FIG. 17D, the spin-on glass layer 47 is lifted off from the silicon wafer by dissolving the release layer. The result is an ultra thin gradient lens array as illustrated generated by the regions of gradient 49. Post thermal treatment can also be preformed to fully cure any unexposed regions of the spin-on glass layer 47. As stated earlier, there will be a range of indices generated within the regions of gradient 49 that are greater and less than the simply thermal cured spin-on glass layer 47.

Figure 18A:
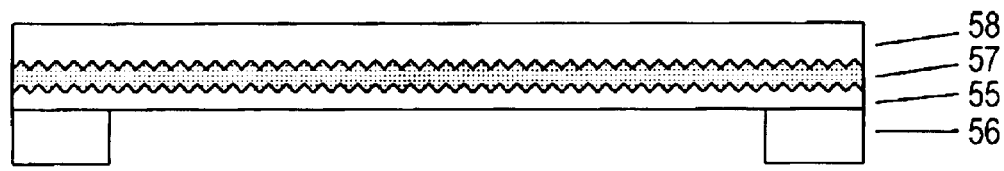
FIG. 18 shows in FIGS. 18A, 18B and 18C schematic views of embedded waveguide between textured overlays.
Figure 18B:
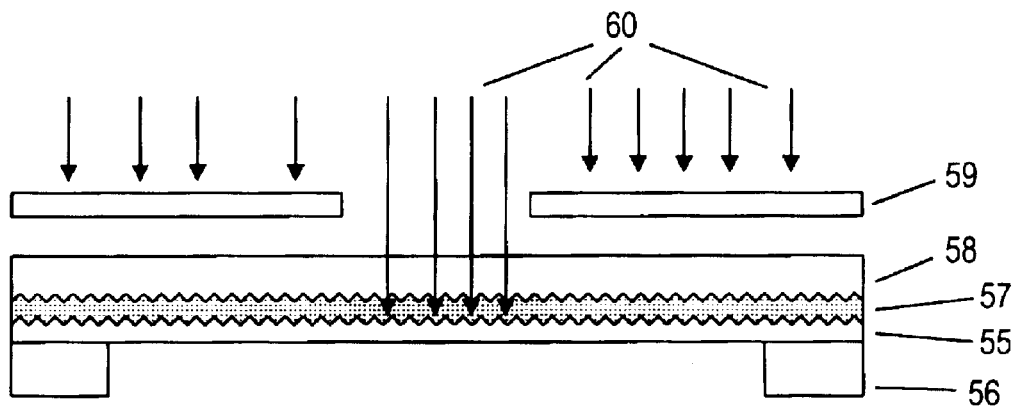
Figure 18C:
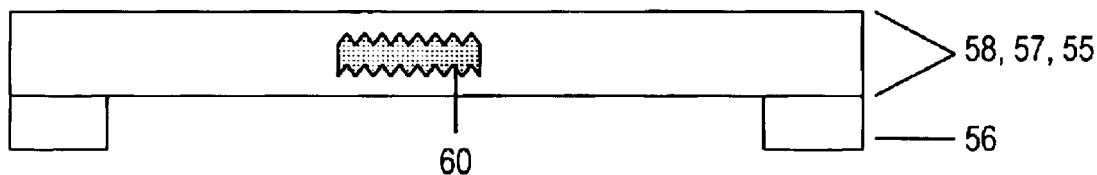

In FIG. 18A, a 5 micron layer of a mixture of cured EBDA/TMPTAcrylate 57 is sandwiched between a top embossed 5 micron PVDF sheet 58 and a bottom embossed 5 micron PVDF sheet 55 where the inside of each cast sheet has a blazed grating surface embossed on the sheets 58 and 55. The PVDF sheet 55 is adhesively mounted on a support ring 56. In FIG. 18B, an aperture mask 59 is used to define where the electron beam 60 exposes the EBDA/TMPTA layer 57. FIG. 18C illustrates the difference in conversion rate between the PVDF sheets 58 and 55 and the EBDA/TMPTA layer 57. This difference allows for the formation of a guiding region 60 within the EBDA/TMPTA layer 57. The grating texture on the PVDF sheets 58 and 55 defines two surface gratings within the guiding region 60.

Figure 19A:
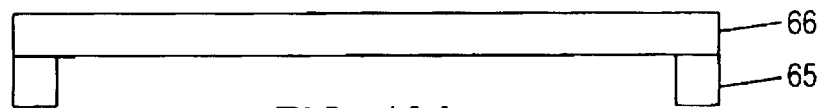
FIG. 19 shows in FIGS. 19A, 19B, 19C, 19D and 19E schematic views of dual sided exposure techniques allowing for overlapping between optical guides.
Figure 19B:
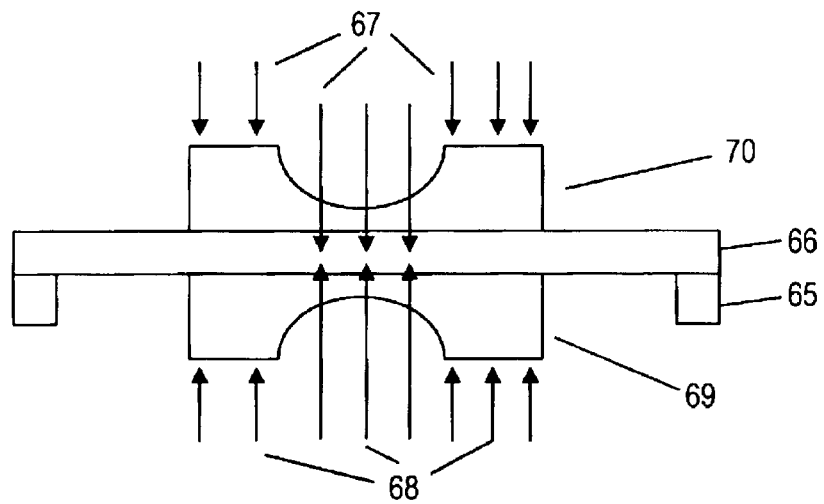
Figure 19C:
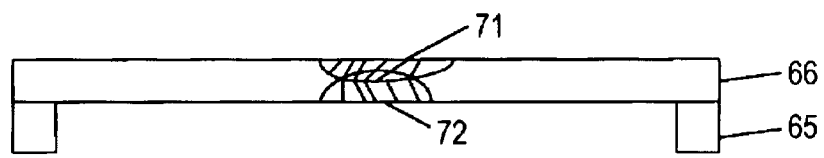
Figure 19D:
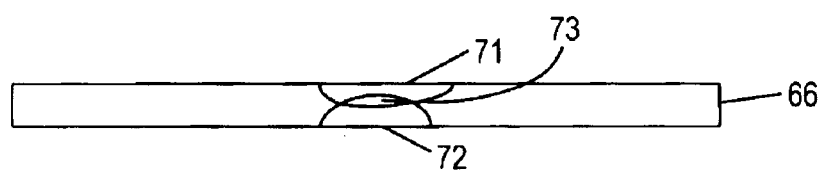
Figure 19E:
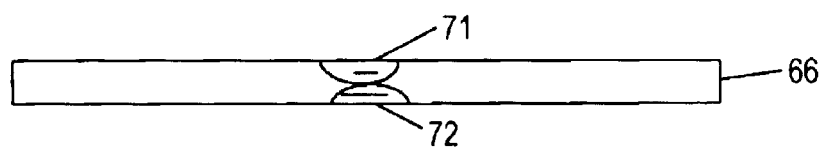

In FIG. 19A, a 10 micron layer of amorphous Fluoropolymer 66, such as Dupont Teflon AF, is attached to a frame 65 as known in the art. FIG. 19B illustrates two embossed, masks 70 and 69 made out of wax such that the two patterns are aligned, exposure using electron beams 67 and 68 occur from the top and bottom as shown in the Figure. FIG. 19C shows how by selecting the penetration depth for the electron beam 67 and 68 the conversion can penetrate over half way through the film, thus regions of gradient 71 and 73 overlap. In FIG. 19D, the overlap region 73 is illustrated due to the double exposure in this region an embedded waveguide is created within the film. FIG. 19E alternately shows that by selecting a lower kinetic energy, isolated guides could be made as well. Due to the ability to vary the embossed masks 70 and 69, it is possible to generate several combinations of intersecting and isolated guides with aligned and unaligned masks.

Figure 20A:
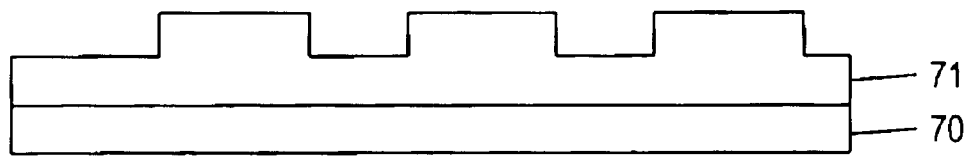
FIG. 20 shows in FIGS. 20A, 20B, 20C and 20D schematic views of forming waveguides in surface embossed starting materials.
Figure 20B:
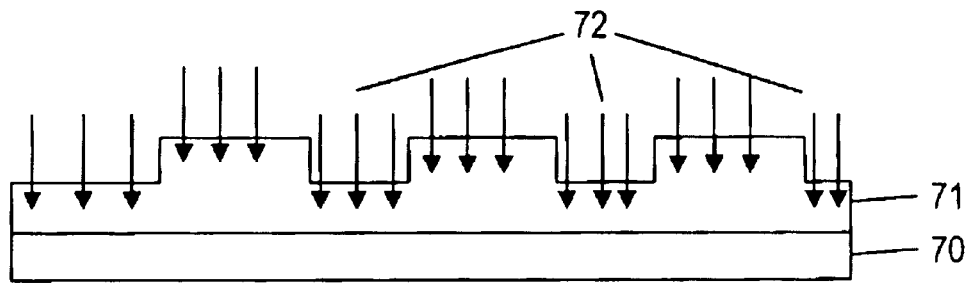
Figure 20C:
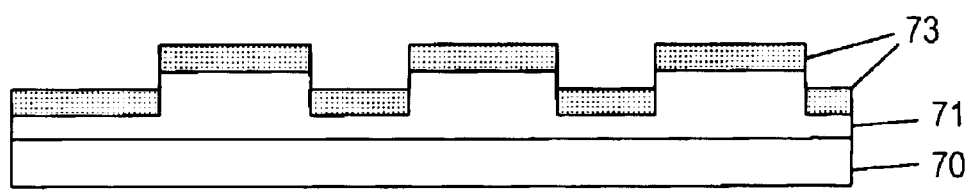
Figure 20D:
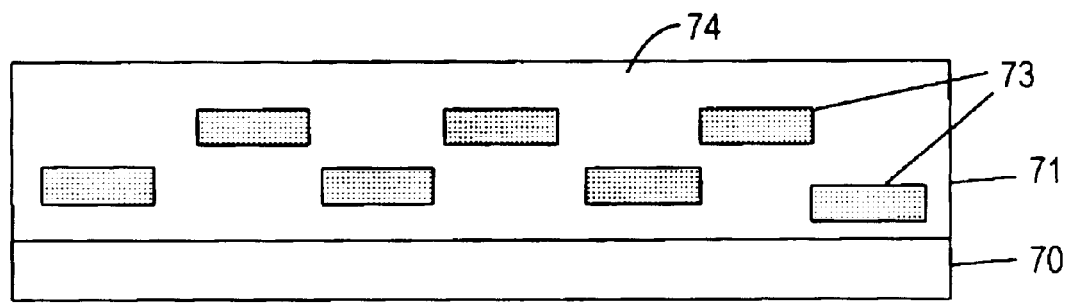

In FIG. 20A, PET film 70 having an embossed acrylate structure 71 is shown. FIG. 20B illustrates how an electron beam 72 can blanket expose the acrylate structure 71 such that the electron penetration depth is less than the structure 71 feature height. FIG. 20C shows how this creates a condition where only the upper portion of the embossed structure and the portion between the embossed structures contains region of gradient 73. In FIG. 20D, a subsequent overcoat 74 of the exposed structure with the original acrylate material used in the acrylate structure 71 leads to regions of gradient 73. This results in a series of waveguides as shown in the figure. A variety of structures are possible for the embossed acrylate structure 71 including gratings, continuous and random structures.

In each example referenced above, multiple layered and 3 dimensional structures are included.

While there has been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

What is claimed is:

1. Apparatus for making at least one spatially graded optical element from at least one starting material comprising: a chamber for providing an exposure atmosphere, a source having a cathode and an anode for providing a large area electron beam within the chamber, a support member located within the chamber for supporting at least one starting material that is to be irradiated, and control means coupled to control the large area electron beam to provide a desired profile within the at least one starting material.

2. The apparatus of claim 1 further comprising: electron beam modifying means for spatially modifying the energy distribution of the electron beam.

3. The apparatus of claim 2 wherein the modifying means is an aperture mask.

4. The apparatus of claim 1 further comprising: electron beam modifying means for kinetically modifying the energy distribution of the electrons from the source.

5. The apparatus of claim 4 wherein the modifying means is a film having a thickness between 0.1 and 10 microns.

6. The apparatus of claim 4 wherein the electron beam modifying means also spatially modifies the energy distribution of the electrons from the source.

7. The apparatus of claim 6 wherein the modifying means is a film having a thickness between 0.1 and 10 microns and a spatially patterned layer.

8. The apparatus of claim 1 further comprising: temperature controlling means for setting the temperature of the at least one starting material on the support member.

9. The apparatus of claim 8 wherein the temperature controlling means is located within the chamber.

10. The apparatus of claim 9 wherein the temperature of the temperature controlling means can adjust the at least one starting material to between 10 Celsius and 1000 Celsius.

11. The apparatus of claim 1 wherein the atmosphere in the chamber is between 1 millitorr and 760 torr.

12. The apparatus of claim 1 wherein the atmosphere in the chamber is oxidizing.

13. The apparatus of claim 1 wherein the atmosphere in the chamber is non-oxidizing.

14. The apparatus of claim 1 wherein the atmosphere in the chamber comprises at least in part nitrogen, argon, oxygen, ammonia, forming gas, helium, methane, hydrogen, or silane, or mixtures thereof.

15. The apparatus of claim 1 wherein the electron charge of the large area electron beam generated by the source is between 5 and 100000 microCoulombs per square centimeter.

16. The apparatus of claim 1 wherein the operating current of the source is between 0.1 and 100 milliamps.

17. The apparatus of claim 1 wherein the operating voltage of the source is between 0.1 and 100 keV.

18. The apparatus of claim 1 wherein the operating voltage of the source is between 0.5 and 30 keV.

19. The apparatus of claim 1 wherein the support member is a frame to which a film of the at least starting material is attached.

20. The apparatus of claim 1 wherein the support member is a substrate.

21. The apparatus of claim 1 further comprising: applying means for applying the at least one starting material to the support member wherein the applying means comprises casting, spin coating, dip coating, chemical vapor deposition, embossing, spraying, roller coating, meniscus coating, or extrusion.

22. The apparatus of claim 1 wherein the at least one starting material has a thickness of between 0.01 and 20 microns.

23. The apparatus of claim 1 wherein the starting material is composed of multiple materials.

24. The apparatus of claim 1 wherein the support member allows for dual sided exposure of the starting material.

25. A method for making spatially graded optical material from at least one starting material comprising the steps of: irradiating the starting material with a large area electron beam source, and controlling the energy of the electron beam source to create a desired profile within the starting material.

26. The method of claim 25 wherein the electron beam source operates between 0.1 and 100 keV.

27. The method of claim 25 wherein the atmosphere in the chamber is between 1 millitorr and 760 torr.

28. The method of claim 25 wherein the temperature of the material is not greater than 1000 degrees Celsius while being irradiated.

29. The method of claim 25 wherein the temperature of the material is between 25 degrees Celsius to 175 degrees Celsius.

30. The method of claim 25 wherein the atmosphere in the chamber is oxidizing.

31. The method of claim 25 wherein the atmosphere in the chamber is non-oxidizing.

32. The method of claim 25 wherein the atmosphere in the chamber comprises at least in part nitrogen, argon, oxygen, ammonia, forming gas, helium, methane, hydrogen, or silane, or mixtures thereof.

33. The method of claim 25 wherein the starting material is irradiated with a radiation dosage between 5 and 100000 microCoulombs per square centimeter.

34. The method of claim 25 wherein the starting material is irradiated with a radiation dosage between 50 and 2000 microCoulombs per square centimeter.

35. The method of claim 25 wherein the electron beam source operating current is between 0.1 milliamps and 100 milliamps.

36. The method of claim 25 wherein the electron beam source operating current is between 0.25 milliamps and 30 milliamps.

37. The method of claim 25 further comprising the step of: forming in the starting material spatially graded optical material by creating additional bond structure in the starting material.

38. The method of claim 37 wherein the desired profile of the starting material that is altered is the three dimensional profile of the complex index of refraction.

39. The method of claim 37 wherein the desired profile of the starting material that is altered is the melt point.

40. The method of claim 37 wherein the desired profile of the starting material that is altered is its optical clarity.

41. The method of claim 37 wherein the desired profile of the starting material that is altered is crystallinity.

42. The method of claim 25 wherein the starting material is a spin-on glass.

43. The method of claim 25 wherein the starting material is a polymer.

44. The method of claim 25 wherein the starting material is a monomer.

45. The method of claim 25 wherein the starting material is an oligomer.

46. The method of claim 25 wherein the starting material is a wax.

47. The method of claim 25 wherein the starting material is an oil.

48. The method of claim 25 wherein the starting material is mixture comprising an inorganic/organic suspension.

49. The method of claim 25 wherein the starting material is a polymer containing an organometallic.

50. The method of claim 25 wherein the starting material is a sol-gel.

51. The method of claim 25 wherein the starting material is a halogenated oil combined with a halogenated monomer.

52. The method of claim 25 wherein the starting material includes an opaque filler dispersed therein.

53. The method of claim 42 wherein the spin-on glass material comprises at least one of methylksiloxane, methylsilsesquiozane, phenylsiloxane, phenylsilsesquioxane, methylphenylsiloxane, methylphenylsilsesquioxane or silicate polymer.

54. The method of claim 42 wherein the spin-on glass material comprises hydrogensiloxane polymers of the general formula (H0–1.0SiO1.5–2.0)x and hydrogensilsesquioxne polymers which have the formula (HsiO1.5)x, where x is greater than 8.

55. The method of claim 42 wherein the spin-on glass material comprises copolymers of hydrogensilsesquioxane and alkoxyhydridosiloxane or hydroxyhydridosiloxane.

56. The method of claim 42 wherein the spin-on glass material comprises organohydridosiloxane polymers of the general formula (H0–1.0SiO1.5–2.0)n(R0–1.0SiO1.5–2.0)m, and organohydridosilsesquioxane polymers of the general formula (HSiO1.5)n(RSiO1.5)m, where m is greater than 0 and the sum of n and m is greater than about 8 and R is alkyl or aryl.

57. The method of claim 43 wherein the polymer material comprises halogenated polyalkylene.

58. The method of claim 57 wherein the halogenated polyalkylene comprises a fluorinated polyalkylene.

59. The method of claim 57 wherein the halogenated polyalkylene comprises a chlorinated polyalkylene.

60. The method of claim 57 wherein the halogenated polyalkylene comprises a chlorofluoropolyalkylene.

61. The method of claim 58 wherein fluorinated polyalkylene comprises polytetrafluoroethane (ethylene), polytrifluoroethylene, polyvinylidene fluoride, polyvinylfluoride, copolymers of fluorinated ethylene or fluorinated vinyl groups with non-fluorinated ethylenes or vinyl groups.

62. The method of claim 43 wherein the polymer comprises copolymers of fluorinated ethylenes and vinyls with straight or substituted cyclic fluoroethers containing one or more oxygens in the ring.

63. The method of claim 43 wherein the polymer comprises poly(fluorinated ethers) in which each linear monomer which contain from one to four carbon atoms between the ether oxygens and the carbons are either perfluorinated, monofluorinated, or not fluorinated.

64. The method of claim 43 wherein the polymer comprises copolymers of wholly fluorinated alklylenes with fluorinated ethers, partly fluorinated alkylenes with wholly fluorinated ethers, wholly fluorinated alkylenes with partly fluorinated ethers, partly fluorinated alkylenes with partly fluorinated ethers, non-fluorinated alkylenes with wholly or partly fluorinated ethers, or non-fluorinated ethers with partly or wholly fluorinated alkylenes.

65. The method of claim 43 wherein the polymer comprises copolymers of alkylenes and ethers in which one kind of the monomers is wholly or partly substituted with chlorine and the other monomer is substituted with fluorine atoms and the chain terminal groups may be similar to those in the chain itself, or different.

66. The method of claim 43 wherein the polymer comprises substituted polyacrylates, polymethacrylates, polyitaconates, polymaleates, and polyfumarates, and their copolymers, in which their substituted side chains are linear with 2 to 24 carbon atoms, and their carbon atoms are fully fluorinated except for the first one or two carbons near the carboxyl oxygen atom such as Fluoroacrylate, Fluoromethacrylate and Fluoroitaconate.

67. The method of claim 43 wherein the polymer comprises fluoro-substituted polystyrenes, in which the ring may be substituted by one or more fluorine atoms, or alternatively, the polystyrene backbone is substituted by up to 3 fluorine atoms per monomer where the ring substitution may be on ring carbons no. 4, 3, 2, 5, or 6, and there can be up to 5 fluorine atoms substituting each ring.

68. The method of claim 43 wherein the polymer comprises fluoro-substituted poly(amic acids) and their corresponding polyimoides obtained by dehydration and ring closure of the precursor poly(amic acids).

69. The method of claim 43 wherein the polymer comprises parylenes, fluorinated and non-fluorinated poly (arylene ethers).

70. The method of claim 43 wherein the polymer comprises copolymers exhibiting block, random, or mixtures thereof.

71. The method of claim 25 wherein an optical device is formed.

\* \* \* \* \*